(12) United States Patent
Shang et al.

(10) Patent No.: US 10,269,290 B2
(45) Date of Patent: Apr. 23, 2019

(54) SHIFT REGISTER UNITS AND DRIVING METHODS THEREOF, GATE DRIVING CIRCUITS AND DISPLAY DEVICES WITH TRANSISTORS HAVING EXTENDED LIFETIME

(71) Applicant: BOE Technology Group Co., Ltd., Beijing (CN)

(72) Inventors: Guangliang Shang, Beijing (CN); Mingfu Han, Beijing (CN); Haoliang Zheng, Beijing (CN); Han-Seung-Woo, Beijing (CN); Im-Yun- Sik, Beijing (CN); Jing Lv, Beijing (CN); Yinglong Huang, Beijing (CN); Jun-Jung- Mok, Beijing (CN); Xue Dong, Beijing (CN); Zhichong Wang, Beijing (CN); Xing Yao, Beijing (CN); Lijun Yuan, Beijing (CN); Zhihe Jin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/680,416

(22) Filed: Aug. 18, 2017

(65) Prior Publication Data
US 2018/0190180 A1 Jul. 5, 2018

(30) Foreign Application Priority Data
Jan. 3, 2017 (CN) .......................... 2017 1 0000691

(51) Int. Cl.
*G09G 3/36* (2006.01)
*G09G 3/20* (2006.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
CPC ........ G09G 2310/0286; G09G 3/3674–3/3681
See application file for complete search history.

(56) References Cited

U.S. PATENT DOCUMENTS 8,041,000 B2 10/2011 Moon et al.
8,457,272 B2 6/2013 Yokoyama et al.
(Continued)

FOREIGN PATENT DOCUMENTS

CN 101752004 A 6/2010
CN 101861625 A 10/2010
(Continued)

OTHER PUBLICATIONS

First Office Action, including Search Report, for Chinese Patent Application No. 201710000691.9, dated Jan. 3, 2019, 16 pages.

*Primary Examiner* — Sanghyuk Park
(74) *Attorney, Agent, or Firm* — Westman, Champlin & Koehler, P.A.

(57) ABSTRACT

Embodiments of the present disclosure provide a shift register unit, a driving method thereof, a gate driving circuit, and a display device. The shift register unit comprises an input circuit, a reset circuit, a plurality of output circuits, a plurality of pull-down circuits and a plurality of pull-down control circuits. During a first time period, all of signals output by the plurality of output circuits are valid. During a second time period, at least one of the signals output by the plurality of output circuits is invalid, wherein the second time period comprises a first sub-period and a second sub-period, and the state of at least one of the signals output by the plurality of output circuits during the first sub-period is opposite to the state thereof during the second sub-period. The shift register unit may enable transistors in a pixel circuit to switch between ON and OFF states, so as to extend lifetime of the transistors.

18 Claims, 12 Drawing Sheets

(51) Int. Cl.
  *G11C 19/28* (2006.01)
  *G09G 3/3266* (2016.01)
(52) U.S. Cl.
  CPC ..... *G11C 19/28* (2013.01); *G09G 2300/0809* (2013.01); *G09G 2310/0267* (2013.01); *G09G 2310/0286* (2013.01); *G09G 2310/08* (2013.01); *G09G 2320/043* (2013.01); *G09G 2330/02* (2013.01)

(56) References Cited

U.S. PATENT DOCUMENTS

| | | | |
|---|---|---|---|
| 8,774,346 B2 | 7/2014 | Son | |
| 9,123,283 B2 | 9/2015 | Wang | |
| 9,886,889 B2 | 2/2018 | Hao et al. | |
| 2001/0033278 A1* | 10/2001 | Ohta | G09G 3/3677 345/204 |
| 2010/0158187 A1* | 6/2010 | Moon | G09G 3/3266 377/76 |
| 2011/0228893 A1 | 9/2011 | Tobita et al. | |
| 2013/0100006 A1* | 4/2013 | Lin | G09G 3/3659 345/94 |

FOREIGN PATENT DOCUMENTS

| | | |
|---|---|---|
| CN | 102945651 A | 2/2013 |
| CN | 103680636 A | 3/2014 |
| CN | 105489190 A | 4/2016 |
| CN | 105702196 A | 6/2016 |
| JP | 2013-69400 A | 4/2013 |

\* cited by examiner

SHIFT REGISTER UNITS AND DRIVING METHODS THEREOF, GATE DRIVING CIRCUITS AND DISPLAY DEVICES WITH TRANSISTORS HAVING EXTENDED LIFETIME

CROSS-REFERENCE TO RELATED APPLICATION(S)

This application claims priority to Chinese Application No. 201710000691.9, titled "SHIFT REGISTER UNITS AND DRIVING METHODS THEREOF, GATE DRIVING CIRCUITS AND DISPLAY DEVICES", filed on Jan. 3, 2017, which is incorporated herein by reference in its entirety.

TECHNICAL FIELD

The present disclosure relates to display technologies, and in particular, to shift register units and driving methods thereof, gate driving circuits and display devices.

BACKGROUND

A display device uses a plurality of pixel units for displaying, and each pixel unit comprises a pixel circuit.

FIG. 1 illustrates a schematic circuit diagram of a conventional pixel circuit. A plurality of pixel circuits, P11, P12, P21, P22, having a same structure are shown in FIG. 1. Take the pixel circuit P11 as an example. The pixel circuit P11 comprises a transistor T11, which connects or disconnects the data line D1 with/from the storage cell C11 under the control of a signal from the gate line G1.

FIG. 2 illustrates a schematic diagram of a signal waveform of a conventional pixel circuit. As shown in FIG. 2, the vertical axis V represents the voltage amplitude of the signal applied to the gate of the transistor T11, and the horizontal axis T represents the time, where VGH represents the high level at which the transistor T11 is turned on, and VGL represents the low level at which the transistor T11 is turned off. During the display of an image by a display device, the transistor T11 is switched between ON and OFF states, and the transistor T11 maintains in an OFF state for a long the time (about 99% of the time). Being in an OFF state for a long time will cause the threshold voltage of the transistor T11 to shifted negatively, which, if severe, would damage the transistor T11, causing the pixel circuit P11 operate abnormally.

It is desired to improve the pixel circuit and the shift register unit for driving the pixel circuit.

SUMMARY

Embodiments of the present disclosure provide a shift register unit and a driving method thereof, a gate driving circuit, and a display device.

According to a first aspect, an embodiment of the present disclosure provides a shift register unit comprising: an input circuit, a reset circuit, a plurality of output circuits, a plurality of pull-down circuits and a plurality of pull-down control circuits. The input circuit is connected to the plurality of output circuits and configured to receive an input signal and output the received input signal to the plurality of output circuits. The reset circuit is configured to reset the plurality of output circuits according to a reset signal. The plurality of output circuits are configured to output output signals based on the input signal and clock signals. The plurality of pull-down circuits are connected to output terminals of the plurality of output circuits and are configured to pull down voltages at the output terminals of the plurality of output circuits. The plurality of pull-down control circuits are connected to the plurality of pull-down circuits and are configured to control the plurality of pull-down circuits. The shift register unit is configured so that, during a first time period, all of the output signals of the plurality of output circuits are valid, and during a second time period, at least one of the output signals of the plurality of output circuits is invalid, wherein the second time period comprises a first sub-period and a second sub-period, and the state of at least one of the output signals of the plurality of output circuits during the first sub-period is opposite to the state thereof during the second sub-period.

In an embodiment of the present disclosure, a time period of each of frames comprises a first time period and a second time period. The frames comprises a first frame and a second frame. The plurality of output circuits comprise a first output circuit and a second output circuit. During the second time period of the first frame, the output signal of the first output circuit is invalid, and the output signal of the second output circuit is valid. During the second time period of the second frame, the output signal of the second output circuit is invalid, and the output signal of the first output circuit is valid.

In an embodiment of the present disclosure, the plurality of pull-down circuits comprise a first pull-down circuit and a second pull-down circuit. The plurality of pull-down control circuits comprise a first pull-down control circuit and a second pull-down control circuit. A connection point connecting the input circuit with the plurality of output circuits is a pull-up point. A connection point connecting the first pull-down control circuit with the first pull-down circuit is a first pull-down point. A connection point connecting the second pull-down control circuit with the second pull-down circuit is a second pull-down point. The first output circuit is connected to the pull-up point and a first clock terminal, and the first output circuit provides a first output terminal. The first pull-down circuit is connected to the first pull-down point, a first voltage terminal, a fifth voltage terminal, the pull-up point, and the first output terminal. The first pull-down control circuit is connected to the input signal terminal, the pull-up point, a third voltage terminal, the first output terminal, the fifth voltage terminal, and the first pull-down point. The second output circuit is connected to the pull-up point and a second clock terminal, and the second output circuit provides a second output terminal. The second pull-down circuit is connected to the second pull-down point, the first voltage terminal, the fifth voltage terminal, the pull-up point, and the second output terminal. The second pull-down control circuit is connected to the input signal terminal, the pull-up point, a fourth voltage terminal, the second output terminal, the fifth voltage terminal, and the second pull-down point.

In an embodiment of the present disclosure, the plurality of pull-down circuits comprise a first pull-down circuit and a second pull-down circuit. The plurality of pull-down control circuits comprise a first pull-down control circuit and a second pull-down control circuit. A connection point connecting the input circuit with the plurality of output circuits is a pull-up point. A connection point connecting the first pull-down control circuit with the first pull-down circuit is a first pull-down point. A connection point connecting the second pull-down control circuit with the second pull-down circuit is a second pull-down point. The first output circuit is connected to the pull-up point and a first clock terminal, and the first output circuit provides a first output terminal. The first pull-down circuit is connected to the first pull-down point, the second pull-down point, a first voltage terminal, a fifth voltage terminal, the pull-up point, and the first output terminal. The first pull-down control circuit is connected to the pull-up point, a third voltage terminal, the fifth voltage terminal, and the first pull-down point. The second output circuit is connected to the pull-up point and a second clock terminal, and the second output circuit provides a second output terminal. The second pull-down circuit is connected to the second pull-down point, the first pull-down point, a second voltage terminal, the fifth voltage terminal, the pull-up point, and the second output terminal. The second pull-down control circuit is connected to the pull-up point, a fourth voltage terminal, the fifth voltage terminal, and the second pull-down point.

In an embodiment of the present disclosure, the input circuit comprises a first transistor. The first transistor has a control terminal and a first terminal both connected to the input signal terminal, and a second terminal connected to the pull-up point. The reset circuit comprises a second transistor. The second transistor has a control terminal connected to a reset signal terminal, a first terminal connected to the fifth voltage terminal, and a second terminal connected to the pull-up point.

In an embodiment of the present disclosure, the first output circuit comprises a third transistor and a first capacitor. The third transistor has a control terminal connected to the pull-up point, a first terminal connected to the first clock terminal, and a second terminal connected to one of the plurality of pull-down circuits. The first capacitor is connected between the control terminal and the second terminal of the third transistor. A connection point connecting the second terminal of the third transistor with the first capacitor is the first output terminal. The second output circuit comprises a fourth transistor and a second capacitor. The fourth transistor has a control terminal connected to the pull-up point, a first terminal connected to the second clock terminal, and a second terminal connected to one of the plurality of pull-down circuits. The second capacitor is connected between the control terminal and the second terminal of the fourth transistor. A connection point connecting the second terminal of the fourth transistor with the second capacitor is the second output terminal.

In an embodiment of the present disclosure, the shift register unit further comprises: a cascade circuit, a cascade pull-down circuit, and a cascade pull-down control circuit. The cascade circuit is configured to output a cascade signal that is used as at least one of an input signal and a reset signal of another shift register unit. The cascade pull-down circuit is connected to an output terminal of the cascade circuit, and is configured to pull-down the output terminal of the cascade circuit. The cascade pull-down control circuit is connected to the cascade pull-down circuit, and is configured to control the cascade pull-down circuit. A connection point connecting the input circuit with the plurality of output circuits is a pull-up point. The cascade circuit comprises a fifth transistor. The fifth transistor has a control terminal connected to the pull-up point, a first terminal connected to a third clock terminal, and a second terminal connected to a third output terminal and also to the cascade pull-down circuit. The cascade pull-down circuit comprises a sixth transistor and a seventh transistor. The sixth transistor has a control terminal connected to the cascade pull-down control circuit, a first terminal connected to the fifth voltage terminal, and a second terminal connected to the third output terminal. The seventh transistor has a control terminal connected to the cascade pull-down control circuit, a first terminal connected to the fifth voltage terminal, and a second terminal connected to the third output terminal. The cascade pull-down control circuit multiplexes the plurality of pull-down control circuits. The control terminal of the sixth transistor is connected to the first pull-down control circuit. The control terminal of the seventh transistor is connected to the second pull-down control circuit.

In an embodiment of the present disclosure, the first pull-down circuit comprises an eighth transistor and a ninth transistor. The eighth transistor has a control terminal connected to the first pull-down point, a first terminal connected to the fifth voltage terminal, and a second terminal connected to the pull-up point. The ninth transistor has a control terminal connected to the first pull-down point, a first terminal connected to the first voltage terminal, and a second terminal connected to the first output terminal. The second pull-down circuit comprises a tenth transistor and an eleventh transistor. The tenth transistor has a control terminal connected to the second pull-down point, a first terminal connected to the fifth voltage terminal, and a second terminal connected to the pull-up point. The eleventh transistor has a control terminal connected to the second pull-down point, a first terminal connected to the first voltage terminal, and a second terminal connected to the second output terminal.

In an embodiment of the present disclosure, the first pull-down control circuit comprises a twelfth transistor, a thirteenth transistor, a fourteenth transistor and a fifteenth transistor. The twelfth transistor has a control terminal and a first terminal both connected to the third voltage terminal, and a second terminal connected to the first pull-down point. The thirteenth transistor has a control terminal connected to the pull-up point, a first terminal connected to the fifth voltage terminal, and a second terminal connected to the first pull-down point. The fourteenth transistor has a control terminal connected to the input signal terminal, a first terminal connected to the fifth voltage terminal, and a second terminal connected to the first pull-down point. The fifteenth transistor has a control terminal connected to the first output terminal, a first terminal connected to the fifth voltage terminal, and a second terminal connected to the first pull-down point. The second pull-down control circuit comprises a sixteenth transistor, a seventeenth transistor, an eighteenth transistor and a nineteenth transistor. The sixteenth transistor has a control terminal and a first terminal both connected to the fourth voltage terminal, and a second terminal connected to the second pull-down point. The seventeenth transistor has a control terminal connected to the pull-up point, a first terminal connected to the fifth voltage terminal, and a second terminal connected to the second pull-down point. The eighteenth transistor has a control terminal connected to the input signal terminal, a first terminal connected to the fifth voltage terminal, and a second terminal connected to the second pull-down point. The nineteenth transistor has a control terminal connected to the second output terminal, a first terminal connected to the fifth voltage terminal, and a second terminal connected to the second pull-down point.

In an embodiment of the present disclosure, the first pull-down circuit comprises an eighth transistor, a ninth transistor and a tenth transistor. The eighth transistor has a control terminal connected to the first pull-down point, a first terminal connected to the fifth voltage terminal, and a second terminal connected to the pull-up point. The ninth transistor has a control terminal connected to the first pull-down point, a first terminal connected to the first voltage terminal, and a second terminal connected to the first output terminal. The tenth transistor has a control terminal connected to the second pull-down point, a first terminal connected to the first voltage terminal, and a second terminal connected to the first output terminal. The second pull-down circuit comprises an eleventh transistor, a twelfth transistor and a thirteenth transistor. The eleventh transistor has a control terminal connected to the second pull-down point, a first terminal connected to the fifth voltage terminal, and a second terminal connected to the pull-up point. The twelfth transistor has a control terminal connected to the first pull-down point, a first terminal connected to the second voltage terminal, and a second terminal connected to the second output terminal. Thirteenth transistor has a control terminal connected to the second pull-down point, a first terminal connected to the second voltage terminal, and a second terminal connected to the second output terminal.

In an embodiment of the present disclosure, the first pull-down control circuit comprises a fourteenth transistor, a fifteenth transistor, a sixteenth transistor and a seventeenth transistor. The fourteenth transistor has a control terminal and a first terminal both connected to the third voltage terminal, and a second terminal connected to a control terminal of the fifteenth transistor. A connection point connecting the second terminal of the fourteenth transistor with the control terminal of the fifteenth transistor is a first pull-down control point. The fifteenth transistor has a control terminal connected to the second terminal of the fourteenth transistor, a first terminal connected to the third voltage terminal, and a second terminal connected to the first pull-down point. The sixteenth transistor has a control terminal connected to the pull-up point, a first terminal connected to the fifth voltage terminal, and a second terminal connected to the first pull-down control point. The seventeenth transistor has a control terminal connected to the pull-up point, a first terminal connected to the fifth voltage terminal, and a second terminal connected to the first pull-down point. The second pull-down control circuit comprises an eighteenth transistor, a nineteenth transistor, a twentieth transistor and a twenty-first transistor. The eighteenth transistor has a control terminal and a first terminal both connected to the fourth voltage terminal, and a second terminal connected to a control terminal of the nineteenth transistor. A connection point connecting the second terminal of the eighteenth transistor with the control terminal of the nineteenth transistor is a second pull-down control point. The nineteenth transistor has a control terminal connected to the second terminal of the eighteenth transistor, a first terminal connected to the fourth voltage terminal, and a second terminal connected to the second pull-down point. The twentieth transistor has a control terminal connected to the pull-up point, a first terminal connected to the fifth voltage terminal, and a second terminal connected to the second pull-down control point. The twenty-first transistor has a control terminal connected to the pull-up point, a first terminal connected to the fifth voltage terminal, and a second terminal connected to the second pull-down point.

According to a second aspect, an embodiment of the present disclosure provides a driving method of a shift register unit, which is used for any one of the shift register units mentioned above, wherein the connection point connecting the input circuit with the plurality of output circuits is the pull-up point. The driving method comprises: during a first time period, causing a voltage at the pull-up point to be valid and the clock signals for the plurality of output circuits to be valid, so output signals of the plurality of output circuits are valid; and during a second time period, pulling down an voltage at an output terminal of at least one output circuit by the pull-down circuit to be invalid, so an output signal of the at least one output circuit is invalid, wherein the second time period comprises a first sub-period and a second sub-period, and the state of at least one of the output signals of the plurality of output circuits during the first sub-period is opposite to the state thereof during the second sub-period.

In an embodiment of the present disclosure, a time period of each of frames comprises a first time period and a second time period. During the second time period of the first frame, the output signal of the first output circuit is pull down by the pull-down circuit to be an invalid voltage, and the output signal of the second output circuit is valid; during the second time period of the second frame, the output signal of the second output circuit is pull down by the pull-down circuit to be an invalid voltage, and the output signal of the first output circuit is valid.

According to a third aspect, an embodiment of the present disclosure provides a gate driving circuit, comprising: a plurality of cascaded shift register units mentioned above.

According to a fourth aspect, an embodiment of the present disclosure provides a display device comprising the gate driving circuit mentioned above.

In the shift register units and driving methods thereof, gate driving circuits and display devices according to embodiments of the present disclosure, transistors in a pixel circuit may switch between ON and OFF states, so as to extend lifetime of the transistors.

BRIEF DESCRIPTION OF THE DRAWINGS

In order to make the technical solutions of embodiments of the present disclosure clearer, drawings of the embodiments will be briefly described below. It should be understood that the drawings described below relate to only some of the embodiments of the present invention and are not intended to limit the invention, in the drawings.

DETAILED DESCRIPTION OF THE EMBODIMENTS

In order to make the technical solutions and advantages of the embodiments of the present disclosure more clear, the technical solutions of the embodiments of the present invention will be described below with reference to the accompanying drawings. Obviously, the embodiments described below are just some, but not all, of the embodiments of the present invention. Other embodiments contemplated, upon the teaching of the described embodiments of the present disclosure, by those skilled in the art without creative efforts are also within the scope of the present invention.

An embodiment of the present disclosure provides a pixel circuit. The pixel circuit comprises a plurality of pixels arranged in a matrix form, wherein each of the pixels comprises a storage module and a plurality of transistors. The storage module may comprise a capacitor. The plurality of transistors are connected in series between a data line and the storage module of the pixel circuit. The respective control terminals of the plurality of transistors are connected with a plurality of scanning lines respectively. The transistors switch between ON and OFF states in accordance with scanning signals on the scanning lines, so that during a first time period, all of the transistors are turned on, and during a second time period, at least one of the plurality of transistors is turned off, wherein the second time period comprises a first sub-period and a second sub-period, and the state of at least one of the plurality of transistors during the first sub-period is opposite to the state thereof during the second sub-period.

An embodiment of the present disclosure also provides a pixel circuit driving method for driving the pixel circuit described above. The pixel circuit driving method comprises steps of: during the first time period, providing valid scanning signals to the plurality of transistors, so that all of the transistors are turned on; and during the second time period, providing an invalid scan signal to at least one of the plurality of transistors, so that the at least one of the plurality of transistors is turned off, wherein the second time period comprises the first sub-period and the second sub-period, and the state of at least one of the scanning signals during the first sub-period is opposite to the state thereof during the second sub-period (i.e. switching between valid and invalid).

According to an embodiment of the present disclosure, the transistors in the pixel circuit can switch between ON and OFF states. In this way, it is possible to prolong the service life of the transistors by controlling the lengths of the first sub-period and the second sub-period to prevent the transistors from being in an OFF state for a long time.

Figure 1:
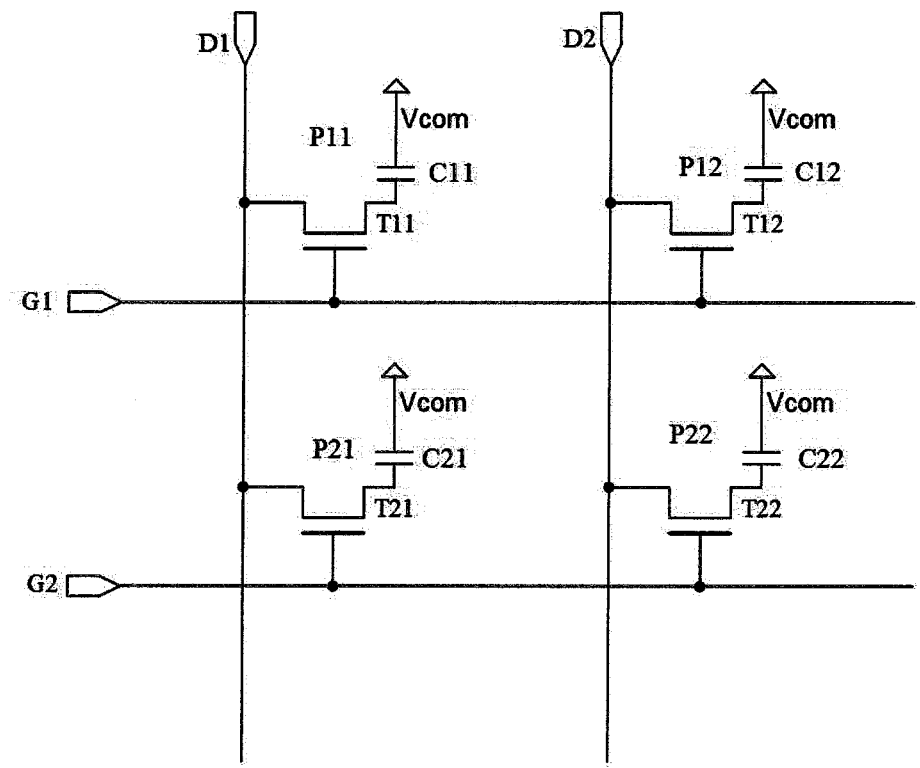
FIG. 1 is a schematic circuit diagram of a conventional pixel circuit.
Figure 2:
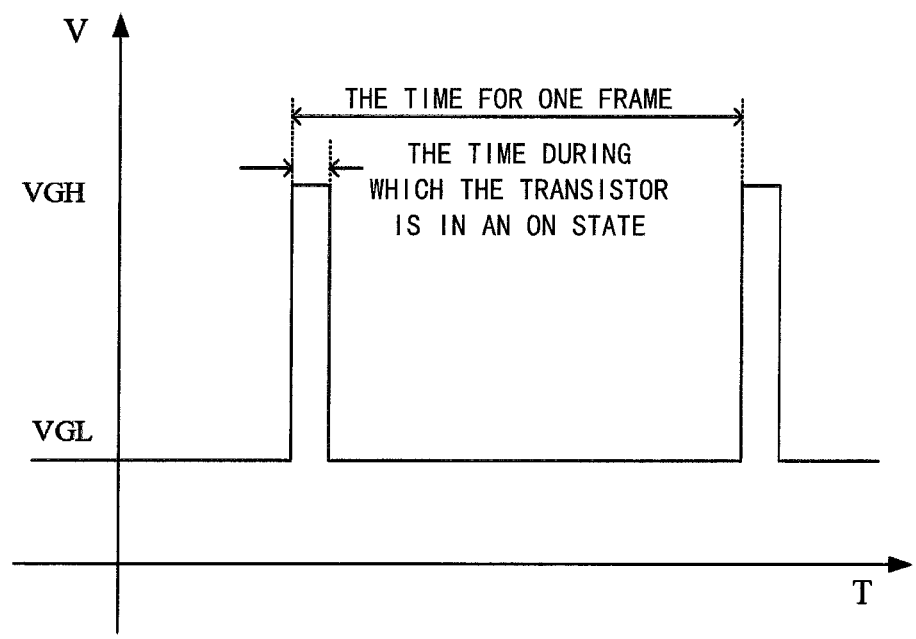
FIG. 2 is a schematic diagram of a signal waveform of a conventional pixel circuit.
Figure 3:
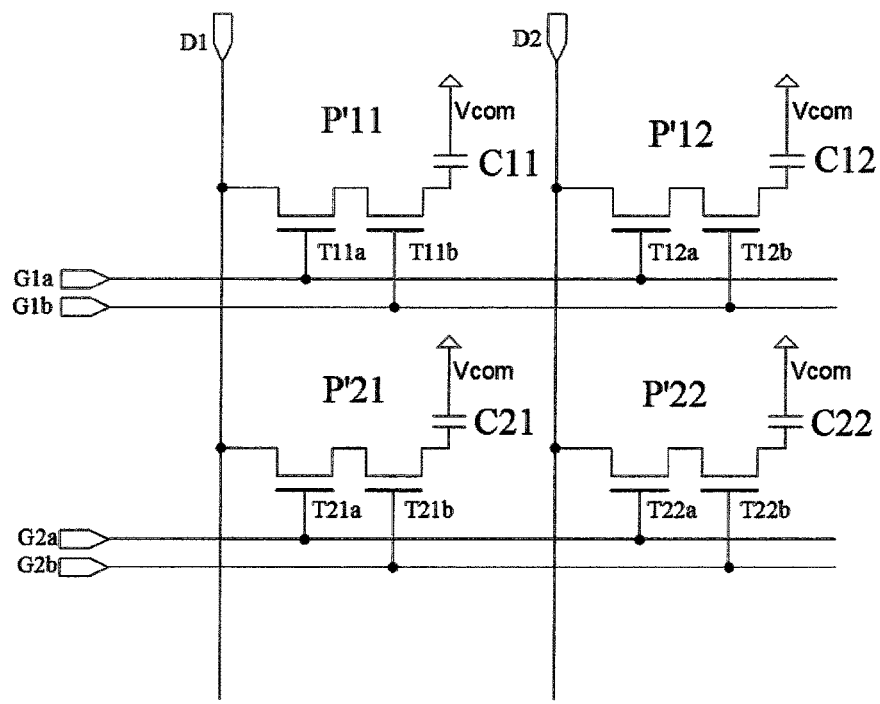
FIG. 3 is a schematic circuit diagram of a pixel circuit according to an embodiment of the present disclosure.
Figure 4:
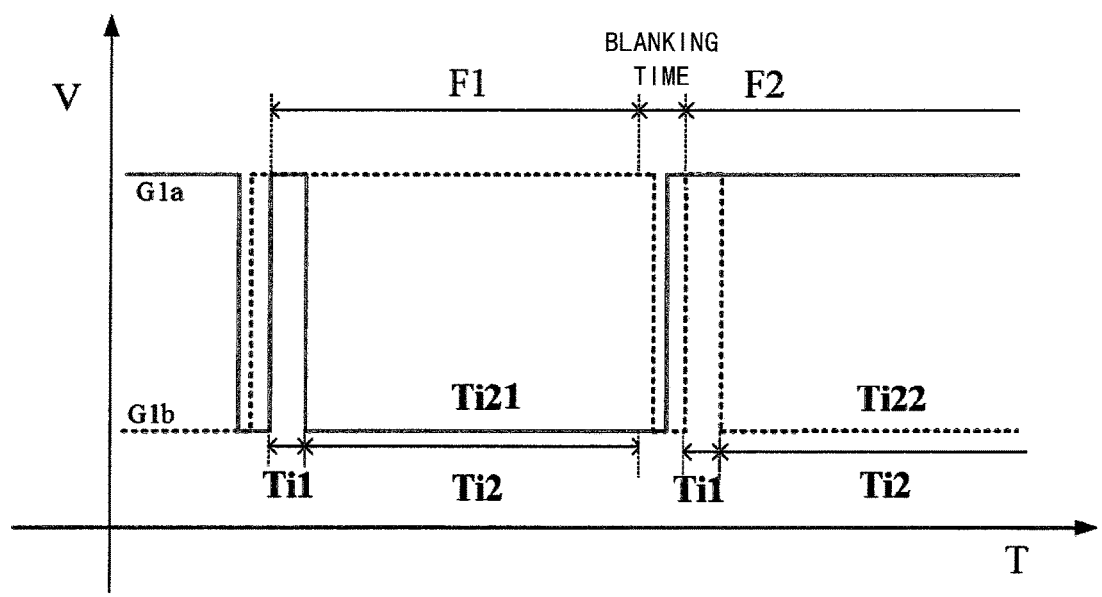
FIG. 4 is a waveform diagram of a signal for driving the pixel circuit shown in FIG. 3.

FIG. 3 is a schematic circuit diagram of a pixel circuit according to an embodiment of the present disclosure. FIG. 4 is a waveform diagram of a signal for driving the pixel circuit shown in FIG. 3.

As shown in FIG. 3, in the embodiment of the present disclosure, taking the pixel P'11 as an example, the plurality of transistors may comprise a first transistor T11a and a second transistor T11b. The first transistor T11a and the second transistor T11b are connected in series between the data line D1 and the storage module C11. The respective control terminals of the first transistor T11a and the second transistor T11b are connected to the scanning lines G1a and G1b, respectively.

As shown in FIG. 4, in the embodiment of the present disclosure, the frames may comprise the first frame and the second frame. The time period of each of the frames comprises the first time period and the second time period. The shift register unit connected to the scanning lines of the pixel circuit comprises a plurality of output circuits, each of which is connected to a respective one of the plurality of scanning lines of the pixel circuit. In the embodiment of the present disclosure, the plurality of output circuits comprise a first output circuit and a second output circuit. During the second time period of the first frame, the signal output from the first output circuit is invalid and the signal output from the second output circuit is valid. During the second time period of the second frame, the signal output from the second output circuit is invalid and the signal output from the first output circuit is valid.

Specifically, during the first time period Ti1 of each frame, valid scanning signals are supplied to the first transistor T11a and the second transistor T11b, so that the first transistor T11a and the second transistor T11b are turned on, connecting the data line D1 with the storage module C11.

During the second time period Ti2 of the first frame F1, an invalid scanning signal is supplied by the first scanning line G1a to the first transistor T11a, and an valid scanning signal is supplied by the second scanning line G1b to the second transistor T11b, so that the first transistor T11a is turned off and the second transistor T11b is turned on, disconnecting the data line D1 from the storage module C11. During the second time period Ti2 of the first frame F2, an invalid scanning signal is supplied to the second transistor T11b, and an valid scanning signal is supplied to the first transistor T11a, so that the second transistor T11b is turned off and the first transistor T11a is turned on, disconnecting the data line D1 from the storage module C11. It should be understood that the valid level refers to a level at which the transistor is turned on, and the invalid level refers to a level at which the transistor is turned off. As an example, the transistors in FIG. 4 are N-type transistors, and the valid level is a high level. If P-type transistors are applied, the valid level is a low level.

As shown in FIG. 4, consider a solution in which the second time period Ti2 of the first frame F1 comprises only the first sub-period Ti21, and the second time period Ti2 of the second frame F2 comprises only the second sub-period Ti22. Such a solution would help simplify the control process. However, it should be understood that the second time period Ti2 in a single frame may comprise the first sub-period Ti21 and the second sub-period Ti22 described above. That is, the state of at least one of the first transistor T11a and the second transistor T11b changes during the second time period Ti2 of a single frame.

In the embodiment of the present disclosure, both of the first transistor T11a and the second transistor T11b may be switched between ON and OFF states and thus avoid being in one state for a long time, which can prolong the service life of the transistors.

An embodiment of the present disclosure also provides a shift register unit for providing a driving signal for the pixel circuit described above.

Figure 5:
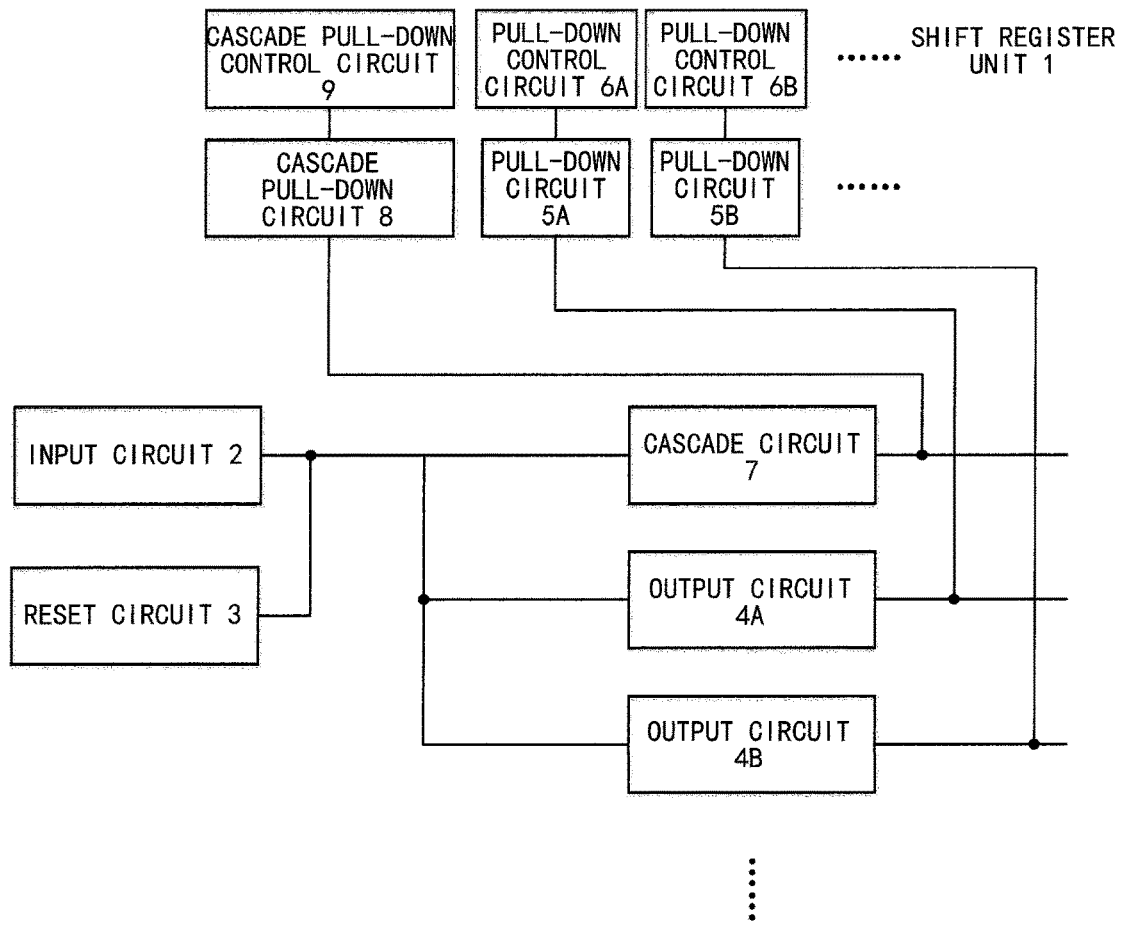
FIG. 5 is a block diagram of a shift register unit according to an embodiment of the present disclosure.

FIG. 5 is a block diagram of a shift register unit according to an embodiment of the present disclosure. As shown in FIG. 5, the shift register unit 1 comprises an input circuit 2, a reset circuit 3, a plurality of output circuits 4a, 4b, . . . , a plurality of pull-down circuits 5a, 5b, . . . , a plurality of pull-down control circuits 6a, . . . . The input circuit 2 has an output terminal connected to the output circuits and is configured to receive an input signal and output the received input signal to the plurality of output circuits. The reset circuit 3 is configured to reset the plurality of output circuits according to a reset signal. The plurality of output circuits 4a, 4b, . . . are configured to output a plurality of output signals based on the input signal and clock signals. The plurality of pull-down circuits 5a, 5b, . . . are connected to the output terminals of the plurality of output circuits 4a, 4b, respectively, and are arranged to pull down the voltages at the output terminals of the plurality of output circuits 4a, 4b, . . . . The plurality of pull-down control circuits 6a, 6b, . . . are connected to the plurality of pull-down circuits 5a, 5b, . . . , respectively, and are configured to control the plurality of pull-down circuits 5a, 5b, . . . . During a first time period, all of the signals output from the plurality of output circuits 4a, 4b, . . . are valid. During a second time period, at least one of the signals output from the plurality of output circuits 4a, 4b, . . . , is invalid, wherein the second time period comprises a first sub-period and a second sub-period, and the state of at least one of the output signals of the plurality of output circuits during the first sub-period is opposite to the state thereof during the second sub-period. The display time period of each frame comprises the first time period and the second time period.

In addition, when it is desired to cascade shift register units to form a gate drive circuit, the shift register unit may further comprise a cascade circuit 7, a cascade pull-down circuit 8 and a cascade pull-down control circuit 9.

The cascade circuit 7 is configured to output a cascade signal, which is used as at least one of the input signal and the reset signal of another shift register unit. The cascade pull-down circuit 8 is connected to the output terminal of the cascade circuit 7 and is configured to pull down the voltage at the output terminal of the cascade circuit 7. The cascade pull-down control circuit 9 is connected to the cascade pull-down circuit 8 and is configured to control the cascade pull-down circuit 8.

Figure 6:
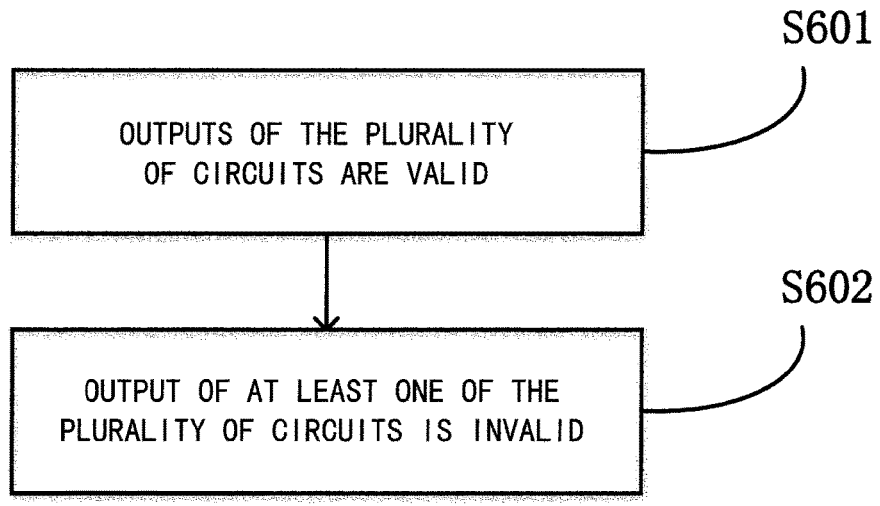
FIG. 6 is a flow chart of a driving method of the shift register unit shown in FIG. 5.

FIG. 6 is a flowchart of a driving method of the shift register unit shown in FIG. 5. For the sake of explanation, the connection point connecting the input circuit 2 with the plurality of output circuits is called as a pull-up point. The driving method starts at step S601. In step S601, during a first time period, the voltage of the pull-up point is valid and the clock signals for the plurality of output circuits 4a, 4b, . . . , are valid, so that the plurality of output signals of the plurality of output circuits 4a, 4b . . . , are valid. Thereafter, in step S602, during a second time period, the voltage at the output terminal of at least one of the plurality of output circuits is pulled down by the pull-down circuit to an invalid voltage, so that the output signal of the at least one of the plurality of output circuits is invalid.

The above-described shift register unit may output a plurality of control signals, causing a plurality of transistors to switch between ON and OFF states, which may prolong the service life of the transistors.

Further, in an embodiment of the present disclosure, the frames may comprise the first frame and the second frame. The time period of each frame comprises a first time period and a second time period. The plurality of output circuits 4a, 4b, . . . , may comprise a first output circuit 4a and a second output circuit 4b. During the second time period of the first frame, the output signal of the first output circuit 4a is pulled down by the pull-down circuit 5a to an invalid voltage, the signal output from the first output circuit 4a is invalid, and the signal output from the second output circuit 4b is valid. During the second time period of the second frame, the output signal of the second output circuit 4b is pulled down by the pull-down circuit 5b to an invalid voltage, the signal output from the second output circuit 4b is invalid, and the signal output from the first output circuit 4a is valid.

Figure 7:
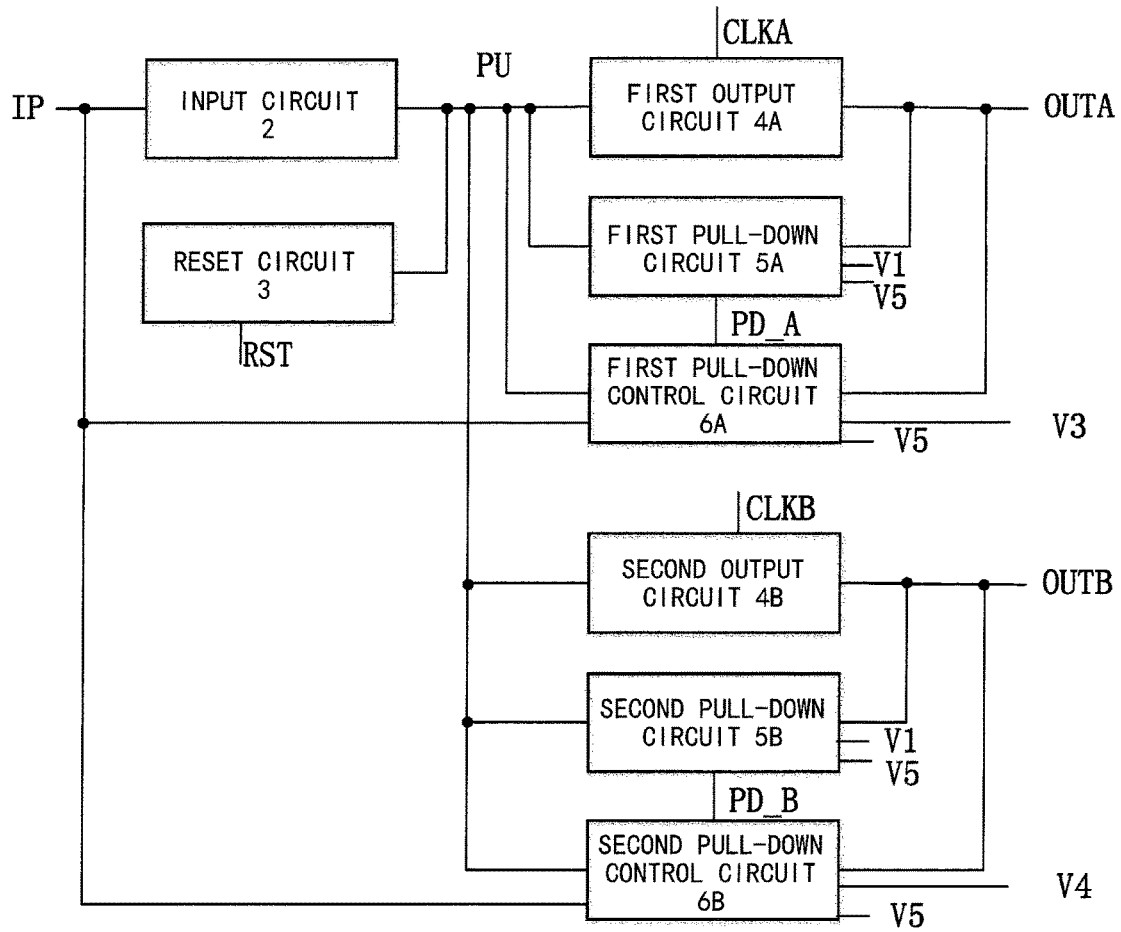
FIG. 7 is a more detailed block diagram of a portion of the shift register unit shown in FIG. 5.

FIG. 7 is a more detailed block diagram of a portion of the shift register unit shown in FIG. 5. As shown in FIG. 7, in the embodiment of the present disclosure, the plurality of pull-down circuits comprise a first pull-down circuit 5a and a second pull-down circuit 5b. The plurality of pull-down control circuits comprises a first pull-down control circuit 6a and a second pull-down control circuit 6b. The connection point connecting the input circuit 2 with the plurality of output circuits is the pull-up point PU. The connection point connecting the first pull-down control circuit 6a with the first pull-down circuit 5a is the first pull-down point PD_A. The connection point connecting the second pull-down control circuit 6b with the second pull-down circuit 5b is the second pull-down point PD_B. The first output circuit 4a is connected to the pull-up point PU and the first clock terminal CLKA, and the first output circuit 4a comprises the first output terminal OUTA. The first pull-down circuit 5a is connected to the first pull-down point PD_A, the first voltage terminal V1 (VGL), the fifth voltage terminal V5 (LVGL), the pull-up point PU, and the first output terminal OUTA. The first pull-down control circuit 6a is connected to the input signal terminal IP, the pull-up point PU, the third voltage terminal V3, the first output terminal OUTA, the fifth voltage terminal V5, and the first pull-down point PD_A. The second output circuit 4b is connected to the pull-up point PU and the second clock terminal CLKB, and the second output circuit 4b comprises the second output terminal OUTB. The second pull-down circuit 5b is connected to the second pull-down point PD_B, the first voltage terminal V1, the fifth voltage terminal V5, the pull-up point PU, and the second output terminal OUTB. The second pull-down control circuit 6b is connected to the input signal terminal IP, the pull-up point PU, the fourth voltage terminal V4, the second output terminal OUTB, the fifth voltage terminal V5, and the second pull-down point PD_B.

Figure 8:
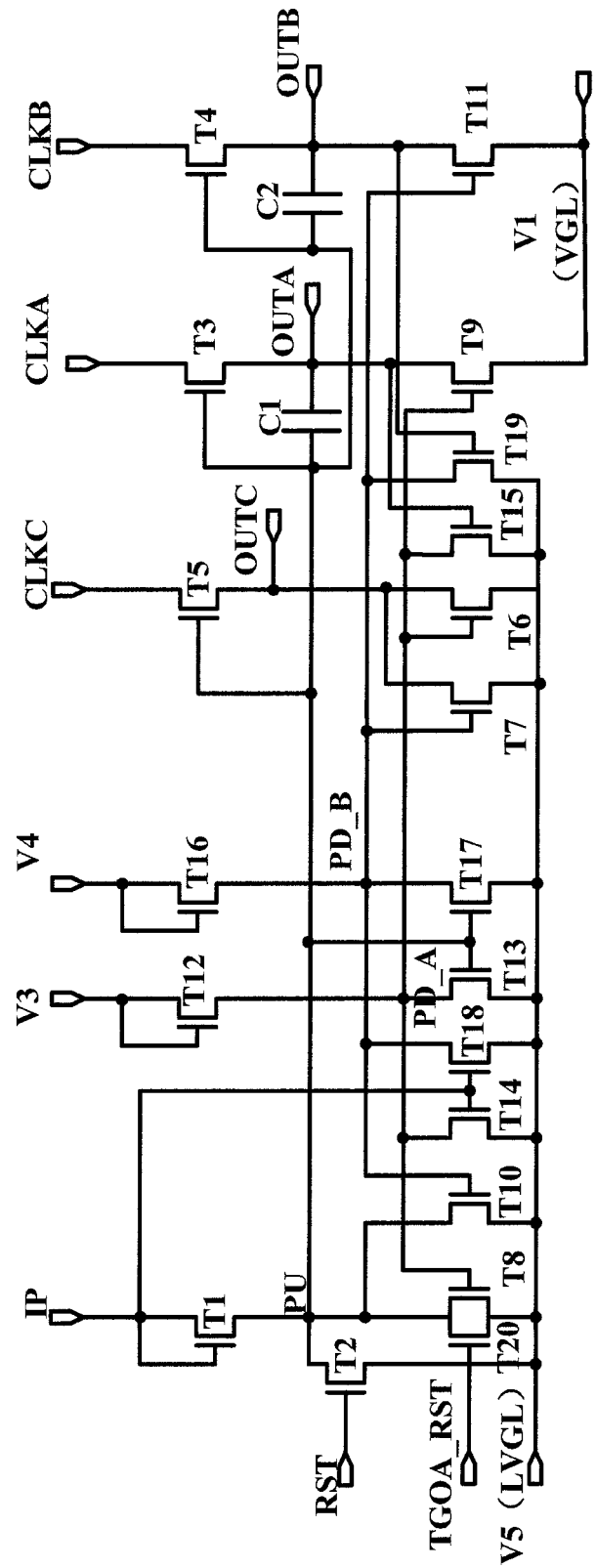
FIG. 8 is a schematic circuit diagram of the shift register unit shown in FIG. 5.

FIG. 8 is a schematic circuit diagram of the shift register unit shown in FIG. 5. As shown in FIG. 8, the input circuit 2 comprises a first transistor T1. The reset circuit 3 comprises a second transistor T2. The first output circuit 4a comprises a third transistor T3 and a first capacitor C1. The second output circuit 4b comprises a fourth transistor T4 and a second capacitor C2. The cascade circuit 7 comprises a fifth transistor T5. The cascade pull-down circuit 8 comprises a sixth transistor T6 and a seventh transistor T7. The cascade pull-down control circuit 9 multiplexes the first pull-down control circuit 6a and the second pull-down control circuit 6b. The first pull-down circuit 5a comprises an eighth transistor T8 and a ninth transistor T9. The second pull-down circuit 5b comprises a tenth transistor T10 and an eleventh transistor T11. The first pull-down control circuit 6a comprises a twelfth transistor T12, a thirteenth transistor T13, a fourteenth transistor T14, and a fifteenth transistor T15. The second pull-down control circuit 6b comprises a sixteenth transistor T16, a seventeenth transistor T17, an eighteenth transistor T18, and a nineteenth transistor T19.

In an embodiment of the present disclosure, an overall reset circuit is also provided, which receives an overall reset signal to reset the shift register unit. The overall reset circuit comprises a twentieth transistor T20. The overall reset circuit may ensure synchronization of the reset processes over multiple shift register units, which is particularly advantageous in the gate drive circuit.

In embodiments of the present disclosure, the gate of a transistor is call as a control terminal. Since the source and drain of a transistor are symmetrical, the source and the drain are not distinguished, i.e. the source of a transistor may be the first terminal (or the second terminal), and the drain of the transistor may be the second terminal (or the first terminal). Further, the function of the transistor may be realized by using any controlled switching device with an input of a gating signal, wherein the controlled intermediate terminal of the switching device for receiving a control signal (e.g., for turning on or turning off the controlled switching device) is called as the control terminal, and the other two terminals are calls as the first terminal and the second terminal, respectively. In the input circuit 2, the first transistor T1 has a control terminal and a first terminal both connected to the input signal terminal IP, and a second terminal connected to the second terminal of the second transistor T2. The connection point connecting the second terminal of the first transistor T1 with the second terminal of the second transistor T2 is the pull-up point PU.

In the reset circuit 3, the second transistor T2 has a control terminal connected to the reset signal terminal RST, a first terminal connected to the fifth voltage terminal V5, and a second terminal connected to the second terminal of the first transistor T1.

In the first output circuit 4a, the third transistor T3 has a control terminal connected to the pull-up point PU, a first terminal connected to the first clock terminal CLKA, and a second terminal connected to the second terminal of the ninth transistor T9. The first capacitor C1 is connected between the gate and the second terminal of the third transistor T3. The connection point connecting the second terminal of the third transistor T3 with the first capacitor C1 is the first output terminal OUTA.

In the second output circuit 4b, t the fourth transistor T4 has a control terminal connected to the pull-up point PU, a first terminal connected to the second clock terminal CLKB, and a second terminal connected to the second terminal of the eleventh transistor T11. The second capacitor C2 is connected between the gate and the second terminal of the fourth transistor T4. The connection point connecting the second terminal of the fourth transistor T4 with the second capacitor C2 is the second output terminal OUTB.

In the cascade circuit 7, the fifth transistor T5 has a control terminal connected to the pull-up point PU, a first terminal connected to the third clock terminal CLKC, and a second terminal connected to the second terminal of the sixth transistor T6. The connection point connecting the second terminal of the fifth transistor T5 with the second terminal of the sixth transistor T6 is the third output terminal OUTC.

In the cascade pull-down circuit 8, the sixth transistor T6 has a control terminal connected to the first pull-down point PD_A, the first terminal connected to the fifth voltage terminal V5, and a second terminal connected to the third output terminal OUTC. The seventh transistor T7 has a control terminal connected to the second pull-down point PD_B, a first terminal connected to the fifth voltage terminal V5, and a second terminal connected to the third output terminal OUTC.

In the first pull-down circuit 5a, the eighth transistor T8 has a control terminal connected to the second terminal of the twelfth transistor T12, a first terminal connected to the fifth voltage terminal V5, and a second terminal o connected to the pull-up point PU. The connection point connecting the control terminal of the eighth transistor T8 with the second terminal of the twelfth transistor T12 is the first pull-down point PD_A. The ninth transistor T9 has a control terminal connected to the first pull-down point PD_A, a first terminal connected to the first voltage terminal V1, and a second terminal connected to the first output terminal OUTA.

In the second pull-down circuit 5b, the tenth transistor T10 has a control terminal connected to the second terminal of the sixteenth transistor T16, a first terminal connected to the fifth voltage terminal V5, and a second terminal connected to the pull-up point PU. The connection point connecting the control terminal of the tenth transistor T10 with the second terminal of the sixteenth transistor T16 is the second pull-down point PD_B. The eleventh transistor T11 has a control terminal connected to the second pull-down point PD_B, a first terminal connected to the first voltage terminal V1, and a second terminal connected to the second output terminal OUTB.

In the first pull-down circuit 5a and the second pull-down circuit 5b, the first terminal of the ninth transistor T9 and the first terminal of the eleventh transistor T11 are connected to the first voltage terminal V1, which may simplify the circuit. It should be understood that another case is also possible where the first terminal of the ninth transistor T9 is connected to the first voltage terminal V1, the first terminal of the eleventh transistor T11 is connected to the second voltage terminal V2, and a same signal apply to both the first voltage terminal V1 and the second voltage Terminal V2.

In the first pull-down control circuit 6a, the twelfth transistor T12 has a control terminal and a first terminal both connected to the third voltage terminal V3, and a second terminal connected to the first pull-down point PD_A. The thirteenth transistor T13 has a control terminal connected to the pull-up point PU, a first terminal connected to the fifth voltage terminal V5, and a second terminal connected to the first pull-down point PD_A. The fourteenth transistor T14 has a control terminal connected to the input signal terminal IP, a first terminal connected to the fifth voltage terminal V5, and a second terminal connected to the first pull-down point PD_A. The fifteenth transistor T15 has a control terminal connected to the first output terminal OUTA, a first terminal connected to the fifth voltage terminal V5, and a second terminal connected to the first pull-down point PD_A.

In the second pull-down control circuit 6b, the sixteenth transistor T16 has a control terminal and a first terminal both connected to the fourth voltage terminal V4, and a second terminal connected to the second pull-down point PD_B. The seventeenth transistor T17 has a control terminal connected to the pull-up point PU, a first terminal connected to the fifth voltage terminal V5, and a second terminal connected to the second pull-down point PD_B. The eighteenth transistor T18 has a control terminal connected to the input signal terminal IP, a first terminal connected to the fifth voltage terminal V5, and a second terminal connected to the second pull-down point PD_B. The nineteenth transistor T19 has a control terminal connected to the second output terminal OUTB, a first terminal connected to the fifth voltage terminal V5, and a second terminal connected to the second pull-down point PD_B.

In the overall reset circuit, the twentieth transistor T20 has a control terminal connected to the overall reset signal terminal TGOA_RST, a first terminal connected to the fifth voltage terminal LVGL, and a second terminal connected to the pull-up point PU.

Figure 9:
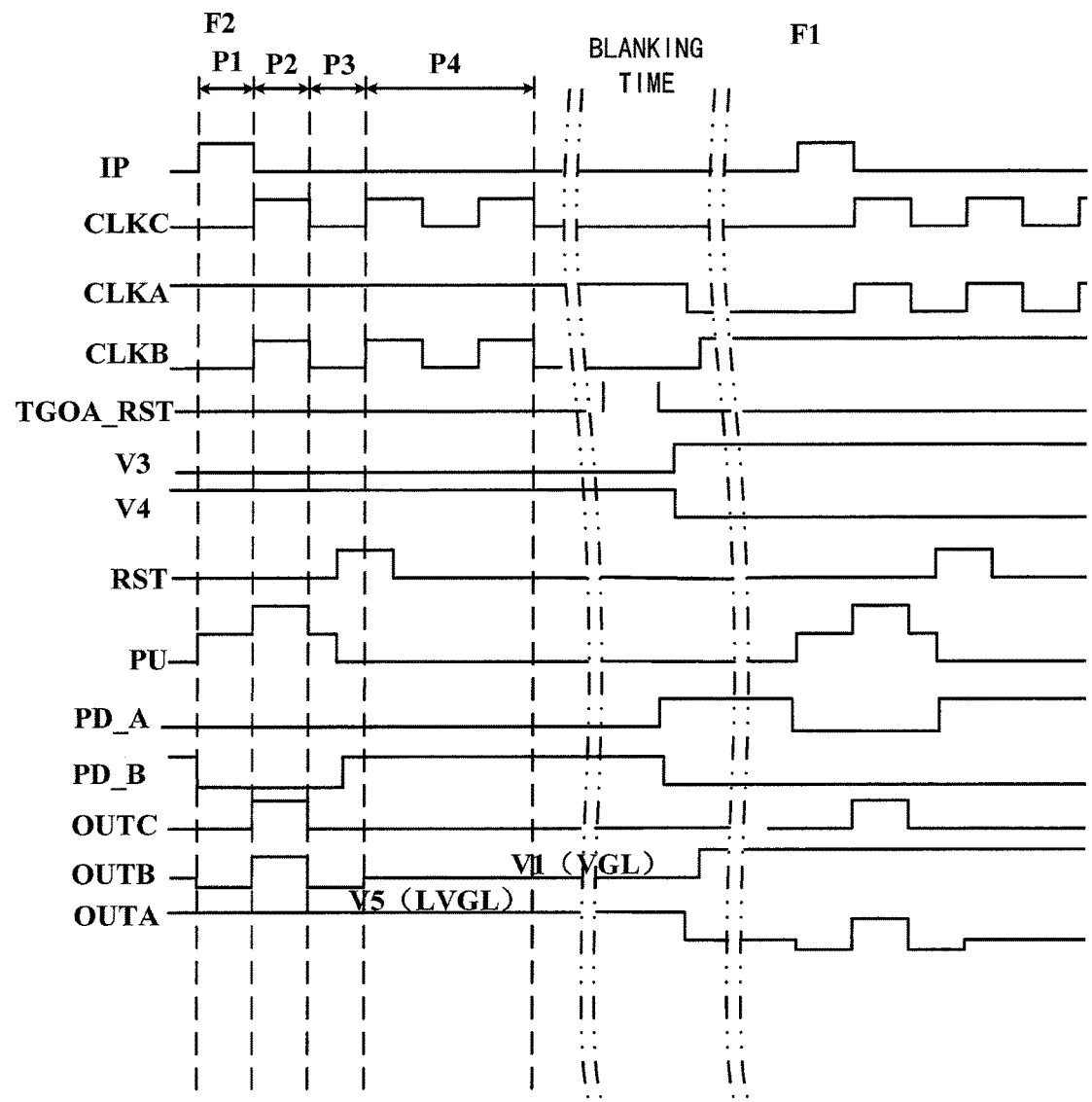
FIG. 9 is a signal timing diagram of the circuit shown in FIG. 8.

FIG. 9 is a signal timing chart of the circuit shown in FIG. 9. FIG. 9 shows an exemplary case in which the transistors in FIG. 8 are all N-type transistors. In such a case, the valid signal is high and the invalid signal is low as shown in FIG. 9.

The waveform of the signal of the second output terminal OUTB for the second frame as shown in FIG. 9 will be described first.

From phase P1 to phase P4, the voltage of the first voltage terminal V1 (its amplitude may be represented by VGL) is always invalid, the voltage of the third voltage terminal V3 is always invalid, the voltage of the fourth voltage terminal V4 is always valid, and the voltage of the fifth voltage terminal V5 (its amplitude may be represented by LVGL) is always invalid. FIG. 9 shows the case wherein LVGL is less than VGL. It should be understood that LVGL may also be equal to VGL.

In phase P1, the signal of the input signal terminal IP is valid, the signal of the second clock terminal CLKB is invalid, the signal of the fourth voltage terminal V4 is valid, and the signal of the reset signal terminal RST is invalid.

The valid signal of the input signal terminal IP causes the first transistor T1 to be turned on, and thus a valid level is applied to the pull-up point PU. The valid level of the pull-up point PU causes the fourth transistor T4 to be turned on and thus the second output terminal OUTB is connected to the second clock terminal CLKB. Since the signal of the second clock end CLKB is invalid, the second output terminal OUTB also outputs an invalid signal.

In addition, the valid level of the pull-up point PU causes the thirteenth transistor T13 and the seventeenth transistor T17 to be turned on, so that the second pull-down point PD_B is connected to the fifth voltage terminal V5. Then, an invalid level is applied to the second pull-down point PD_B, so that the eleventh transistor T11 is turned off. Therefore, the signal of the pull-up point PU is valid, the signal of the second pull-down point PD_B is invalid, and the signal of the second output terminal OUTB is invalid.

In phase P2, the signal of the input signal terminal IP is invalid, the signal of the second clock terminal CLKB is valid, and the signal of the reset signal terminal RST is invalid.

The signal of the pull-up point PU remains valid and the fourth transistor T4 remains in an ON state. The valid signal of the second clock terminal CLKB causes the second output terminal OUTB to output a valid signal. The level of the pull-up point PU is further increased by the bootstrap effect of the first capacitor C1, so that the second output terminal OUTB can stably output a valid level.

In addition, the valid level of the pull-up point PU causes the thirteenth transistor T13 and the seventeenth transistor T17 to be turned on, so that the second pull-down point PD_B is connected to the fifth voltage terminal V5. Then an invalid level is applied to the second pull-down point PD_B, so that the eleventh transistor T11 is turned off. The valid signal of the fourth voltage terminal V4 causes the sixteenth transistor T16 to be turned on, so that the second pull-down point PD_B is connected to the high level through the sixteenth transistor T16 and to the low level through the seventeenth transistor T17. In the embodiment of the present disclosure, the characteristic parameters (for example, the width-to-length ratio) of the sixteenth transistor T16 and the seventeenth transistor T17 are set such that the second pull-down point PD_B remains at a low level.

Therefore, the signal of the pull-up point PU is valid, the signal of the second pull-down point PD_B is invalid, and the signal of the second output terminal OUTB is valid.

In phase P3, the signal of the input signal terminal IP is invalid and the signal of the second clock terminal CLKB is invalid. The signal of the reset signal terminal RST is switched from invalid to valid.

The invalid signal of the second clock terminal CLKB causes the signal of the second output terminal OUTB to be invalid. When the signal of the reset signal terminal RST is valid, the second transistor T2 is turned on, the pull-up point PU and the fifth voltage terminal V5 are turned on, and the level of the pull-up point PU is switched to be invalid. After the level of the pull-up point PU is switched to be invalid, the seventeenth transistor T17 is turned off, the second pull-down point PD_B is disconnected from the fifth voltage terminal V5, and since the fourth voltage terminal V4 is valid, the level of the second pull-Point PD_B is switched to be valid.

Therefore, the signal of the pull-up point PU is switched from valid to invalid, the signal of the second pull-down point PD_B is switched from invalid to valid, and the signal of the second output terminal OUTB is invalid.

In phase P4, the signal of the input signal terminal IP is invalid, the signal of the second clock terminal CLKB is switched between valid and invalid, and the signal of the reset signal terminal RST is switched from valid to invalid.

Since the signal of the input signal terminal IP remains to be invalid, the level of the pull-up point PU remains to be invalid, the fourth transistor T4 remains in an OFF state, and the second output terminal OUTB outputs an invalid signal. In addition, the signal of the fourth voltage terminal V4 remains to be valid, so that the signal of the second pull-down point PD_B remains to be valid. Therefore, the eleventh transistor T11 remains in an ON state, the second output terminal OUTB remains to be pulled-down, and the signal outputted from the second output terminal OUTB maintains to be invalid.

Therefore, the signal of the pull-up point PU is invalid and the signal of the second output terminal OUTB is invalid.

Next, the waveform of the signal of the first output terminal OUTA will be described. During phases P1 to P4, the signal of the first clock terminal CLKA is always valid. Therefore, the first output terminal OUTA outputs an valid signal as long as the pull-up point PU is valid which causes the third transistor T3 to be turned on. In addition, the level of the first pull-down point PD_A is always invalid, and the ninth transistor T9 is always in an OFF state, which will not pull down the voltage of the first output terminal OUTA. Therefore, when the level of the PU is invalid, the level of the first output terminal OUTA can maintain to be valid. During phases P1 to P4, the level of the first output terminal OUTA is always valid.

Finally, the waveform of the signal of the third output terminal OUTC will be described. In phase P2, since the level of the pull-up point PU is valid, the fifth transistor T5 is turned on, which connects the third output terminal OUTC with the third clock terminal CLKC. The signal of the third clock terminal CLKC is valid, so that the third output terminal OUTC outputs a valid signal. In other phases, the level of the pull-up point PU and the signal of the third clock terminal CLKC cannot be valid at the same time, and the third output terminal OUTC outputs an invalid signal.

In the above description, phase P2 is the first time period, and phases P1, P3 and P4 are the second time periods.

In FIG. 9, the signal of the first clock terminal CLKA in the second frame is same as the signal of the second clock end CLKB in the first frame, and the signal of the second clock terminal CLKB in the second frame is same as the signal of the first clock terminal CLKA in the first frame. The signal of the third voltage terminal V3 in the second frame is same as the signal of the fourth voltage terminal V4 in the first frame, and the signal of the fourth voltage terminal V4 in the second frame is same as the signal of the third voltage terminal V3 in the first frame. This causes the signal output from the first output terminal OUTA in the first frame to be same as the signal output from the second output terminal OUTB in the second frame, and the signal output from the second output terminal OUTB in the first frame is same as the signal output from the first output terminal OUTA in the second frame. During the second time period of the first frame and the second time period of the second frame, the state of the signal outputted from the first output terminal OUTA switches between valid and invalid, and the state of the signal outputted from the second output terminal OUTB also switches between valid and invalid.

It should be understood that the first frame and the second frame may be frames occurred alternately. Alternatively, successive multiple first frames may occur, and then a second frame(s) occur.

Figure 10:
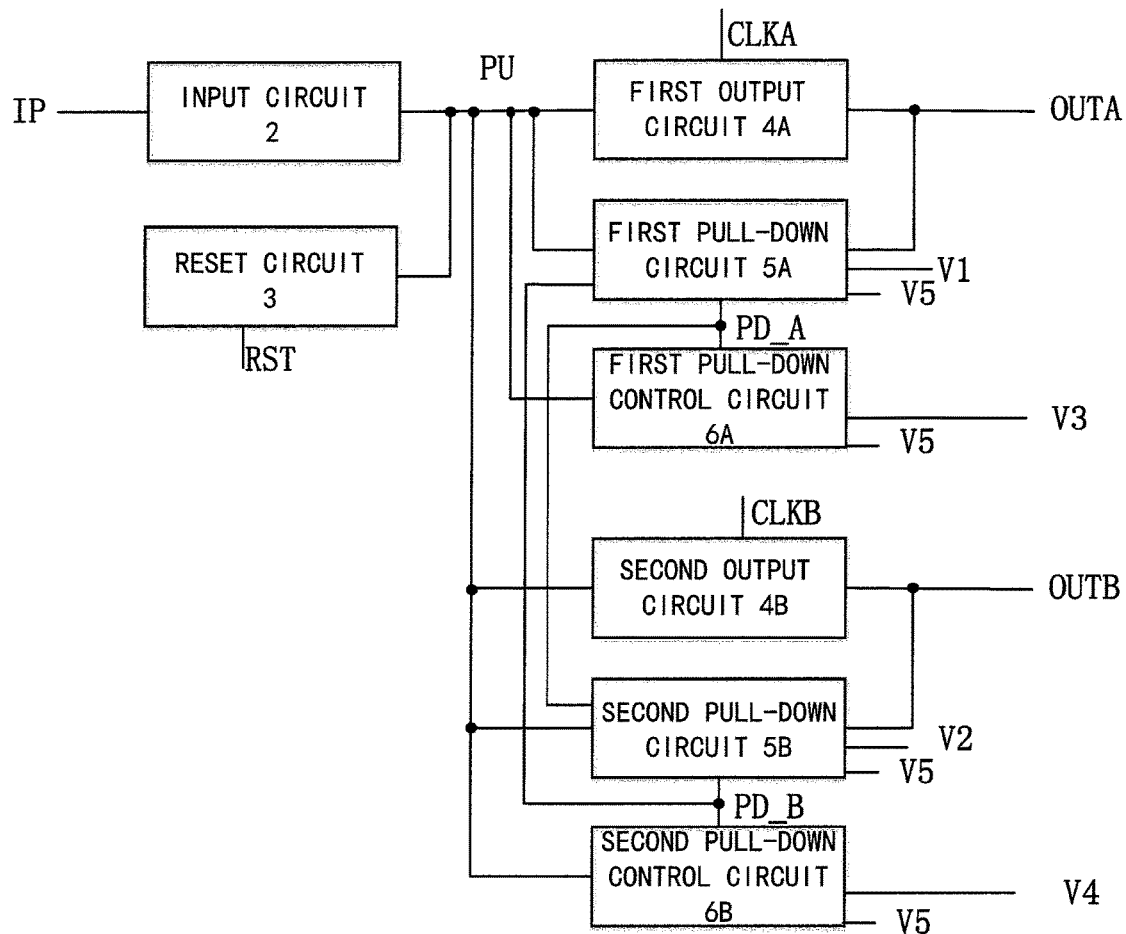
FIG. 10 is another more detailed block diagram of a portion of the shift register unit shown in FIG. 5.

FIG. 10 is another more detailed block diagram of a portion of the shift register unit shown in FIG. 5. As shown in FIG. 10, the plurality of pull-down circuits comprise a first pull-down circuit 5a and a second pull-down circuit 5b. The plurality of pull-down control circuits comprises a first pull-down control circuit 6a and a second pull-down control circuit 6b. The connection point connecting the input circuit 2 with the plurality of output circuits is the pull-up point PU. The connection point connecting the first pull-down control circuit 6a with the first pull-down circuit 5a is the first pull-down point PD_A. The connection point connecting the second pull-down control circuit 6b with the second pull-down circuit 5b is the second pull-down point PD_B. The first output circuit 4a is connected to a pull-up point PU and the first clock terminal CLKA, and the first output circuit 4a comprises the first output terminal OUTA. The first pull-down circuit 5a is connected to the first pull-down point PD_A, the second pull-down point PD_B, the first voltage terminal V1, the fifth voltage terminal V5 (its amplitude may be represented by Vref), the pull-up point PU, and the first output terminal OUTA. The first pull-down control circuit 6a is connected to the pull-up point PU, the third voltage terminal V3, the fifth voltage terminal V5, and the first pull-down point PD_A. The second output circuit 4b is connected to the pull-up point PU and the second clock terminal CLKB, and the second output circuit comprises the second output terminal OUTB. The second pull-down circuit 5b is connected to the second pull-down point PD_B, the first pull-down point PD_A, the second voltage terminal V2, the fifth voltage terminal V5, the pull-up point PU, and the second output terminal OUTB. The second pull-down control circuit 6b is connected to the pull-up point PU, the fourth voltage terminal V4, the fifth voltage terminal V5, and the second pull-down point PD_B.

Figure 11:
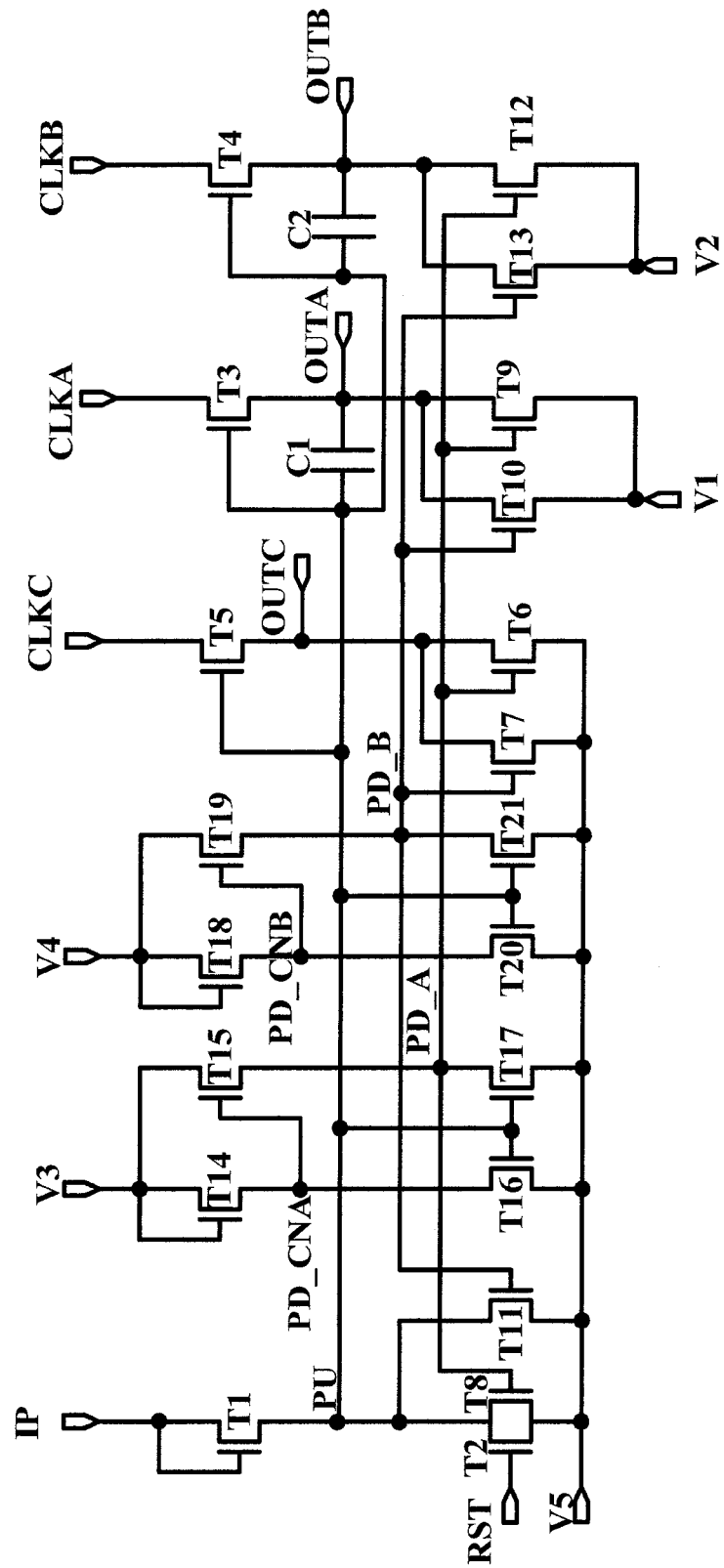
FIG. 11 is another schematic circuit diagram of the shift register unit shown in FIG. 5.

FIG. 11 is another schematic circuit diagram of the shift register unit shown in FIG. 5. As shown in FIG. 11, the input circuit 2 comprises a first transistor T1. The reset circuit 3 comprises a second transistor T2. The first output circuit 4a comprises a third transistor T3 and a first capacitor C1. The second output circuit 4b comprises a fourth transistor T4 and a second capacitor C2. The cascade circuit 7 comprises a fifth transistor T5. The cascaded pull-down circuit 8 comprises a sixth transistor T6 and a seventh transistor T7. The cascaded pull-down control circuit 9 multiplexes the first pull-down control circuit 6a and the second pull-down control circuit 6b. The first pull-down circuit 5a comprises an eighth transistor T8, a ninth transistor T9, and a tenth transistor T10. The second pull-down circuit 5b comprises an eleventh transistor T11, a twelfth transistor T12, and a thirteenth transistor T13. The first pull-down control circuit 6a comprises a fourteenth transistor T14, a fifteenth transistor T15, a sixteenth transistor T16, and a seventeenth transistor T17. The second pull-down control circuit 6b comprises an eighteenth transistor T18, a thirteenth transistor T19, a twentieth transistor T20, and a twenty-first transistor T21.

In the input circuit 2, the first transistor T1 has a control terminal and a first terminal both connected to the input signal terminal IP, and a second terminal connected to the second terminal of the second transistor T2. The connection point connecting the second terminal of the first transistor T1 with the second terminal of the second transistor T2 is the pull-up point PU.

In the reset circuit 3, the second transistor T2 has a control terminal connected to the reset signal terminal, a first terminal connected to the fifth voltage terminal V5, and a second terminal connected to the second terminal of the first transistor T1.

In the first output circuit 4a, the third transistor T3 has a control terminal connected to the pull-up point PU, a first terminal connected to the first clock terminal CLKA, and a second terminal connected to the second terminal of the ninth transistor T9. The first capacitor C1 is connected between the control terminal and the second terminal of the third transistor T3. The connection point connecting the second terminal of the third transistor T3 with the first capacitor C1 is the first output terminal OUTA.

In the second output circuit 4b, the fourth transistor T4 has a control terminal connected to the pull-up point PU, a first terminal connected to the second clock terminal CLKB, and a second terminal connected to the second terminal of the twentieth transistor T20. The second capacitor C2 is connected between the control terminal and the second terminal of the fourth transistor T4. The connection point connecting the second terminal of the fourth transistor T4 with the second capacitor C2 is the second output terminal OUTB. In the cascade circuit 7, the fifth transistor T5 has a control terminal connected to the pull-up point PU, a first terminal connected to the third clock terminal CLKC, and a second terminal connected to the second terminal of the sixth transistor T6.

In the cascaded pull-down circuit 8, the sixth transistor T6 has a control terminal connected to the first pull-down point PD_A, a first terminal connected to the fifth voltage terminal V5, and a second terminal connected to the second terminal of the fifth transistor T5. The connection point connecting the second terminal of the sixth transistor T6 with the second terminal of the fifth transistor T5 is the third output terminal OUTC. The seventh transistor T7 has a control terminal connected to the second pull-down point PD_B, a first terminal connected to the fifth voltage terminal V5, and a second terminal connected to the third output terminal OUTC.

In the first pull-down circuit 5a, the eighth transistor T8 has a control terminal connected to the second terminal of the fifteenth transistor T15, a first terminal connected to the fifth voltage terminal V5, and a second terminal connected to the pull-up point PU. The connection point connecting the control terminal of the eighth transistor T8 with the fifteenth transistor T15 is the first pull-down point PD_A. The ninth transistor T9 has a control terminal connected to the first pull-down point PD_A, a first terminal connected to the first voltage terminal V1, and a second terminal connected to the first output terminal OUTA. The tenth transistor T10 has a control terminal connected to the second pull-down point PD_B, a first terminal connected to the first voltage terminal V1, and a second terminal connected to the first output terminal OUTA.

In the second pull-down circuit 5b, the eleventh transistor T11 has a control terminal connected to the second terminal of the nineteenth transistor T19, a first terminal connected to the fifth voltage terminal V5, and a second terminal connected to the pull-up point PU. The connection point connecting the control terminal of the eleventh transistor T11 with the nineteenth transistor T19 is the second pull-down point PD_B. The twelfth transistor T12 has a control terminal connected to the first pull-down point PD_A, a first terminal connected to the second voltage terminal V2, and a second terminal connected to the second output terminal OUTB. The thirteenth transistor T13 has a control terminal connected to the second pull-down point PD_B, a first terminal connected to the second voltage terminal V2, and a second terminal connected to the second output terminal OUTB.

In the first pull-down control circuit 6a, the fourteenth transistor T14 has a control terminal and a first terminal both connected to the third voltage terminal V3, and a second terminal connected to the control terminal of the fifteenth transistor T15. The connection point connecting the second terminal of the fourteenth transistor T14 with the control terminal of the fifteenth transistor T15 is the first pull-down control point PD_CNA. The fifteenth transistor T15 has a control terminal connected to the second terminal of the fourteenth transistor T14, a first terminal connected to the third voltage terminal V3, and a second terminal connected to the first pull-down point PD_A. The sixteenth transistor T16 has a control terminal connected to the pull-up point PU, a first terminal connected to the fifth voltage terminal V5, and a second terminal connected to the first pull-down control point PD_CNA. The seventeenth transistor T17 has a control terminal connected to the pull-up point PU, a first terminal connected to the fifth voltage terminal V5, and a second terminal connected to the first pull-down point PD_A.

In the second pull-down control circuit 6b, the eighth transistor T18 has a control terminal and a first terminal both connected to the fourth voltage terminal V4, and a second terminal connected to the control terminal of the nineteenth transistor T19. The connection point connecting the second terminal of the eighteenth transistor T18 with the control terminal of the nineteenth transistor T19 is the second pull-down control point PD_CNB. The nineteenth transistor T19 has a control terminal connected to the second terminal of the eighteenth transistor T18, a first terminal connected to the fourth voltage terminal V4, and s second terminal connected to the second pull-down point PD_B. The twentieth transistor T20 has a control terminal connected to the pull-up point PU, a first terminal connected to the fifth voltage terminal V5, and a second terminal connected to the second pull-down control point PD_CNB. The twenty-first transistor T21 has a control terminal connected to the pull-up point PU, a first terminal connected to the fifth voltage terminal V5, and a second terminal connected to the second pull-down point PD_B.

Figure 12:
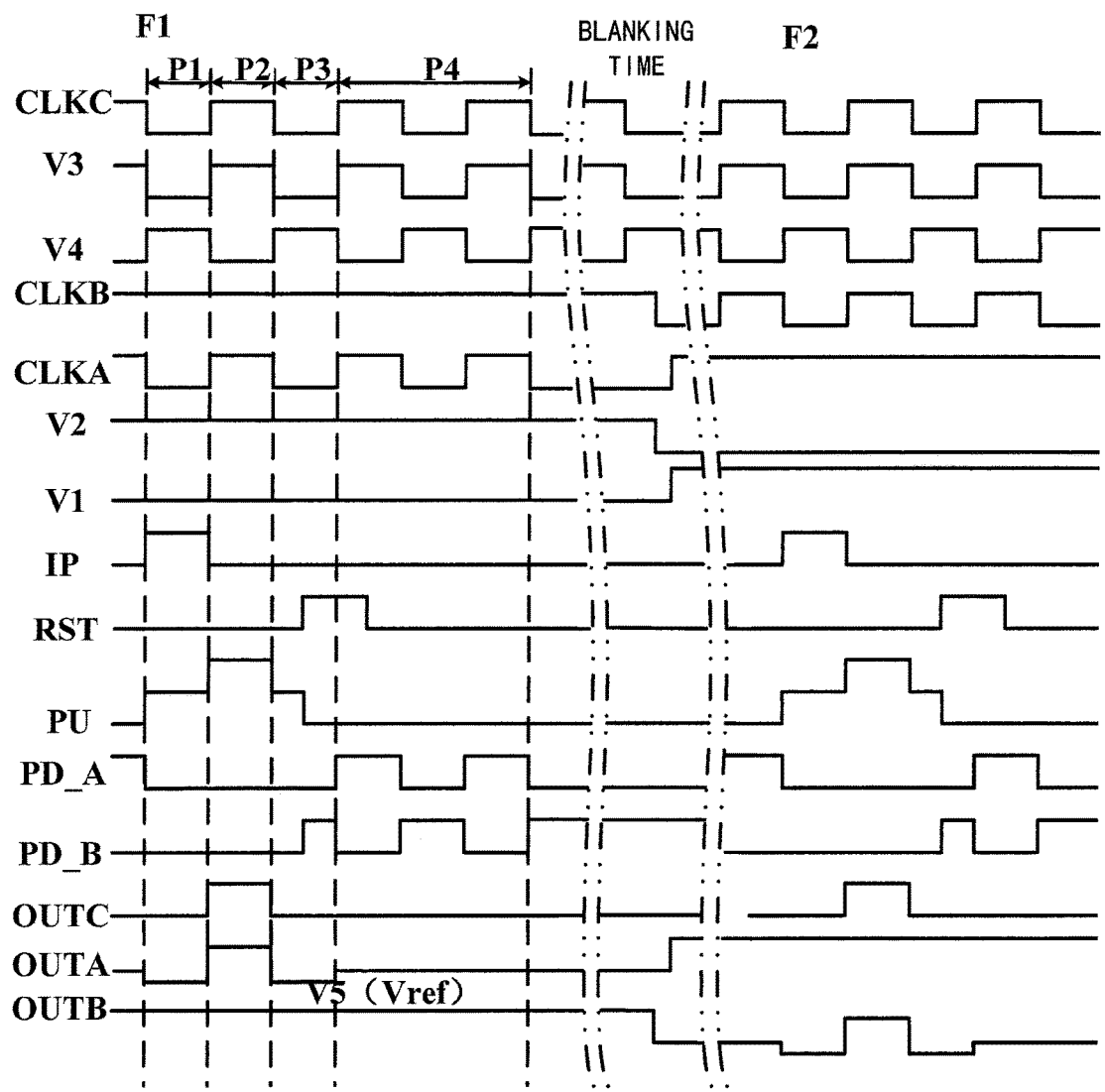
FIG. 12 is a signal timing diagram of the circuit shown in FIG. 11.

FIG. 12 is a signal timing chart of the circuit shown in FIG. 11. FIG. 12 shows an exemplary case in which the transistors in FIG. 11 are all N-type transistors. In such a case, the valid signal is high and the invalid signal is low as shown in FIG. 12. Taking the first frame as an example, the waveform of the signal of the first output terminal OUTA as shown in FIG. 12 will be described first.

In phase P1, the signal of the input signal terminal IP is valid, the signal of the first clock terminal CLKA is invalid, the signal of the first voltage terminal V1 is invalid, the signal of the third voltage terminal V3 is invalid, the signal of the fifth voltage terminal V5 is invalid, and the signal of the reset signal terminal RST is invalid.

The valid signal of the input signal terminal IP causes the first transistor T1 to be turned on and a valid level is applied to the pull-up point PU. The valid level of the pull-up point PU causes the third transistor T3 to be turned on and thus the first output terminal OUTA is connected to the first clock terminal CLKA. Since the signal of the first clock terminal CLKA is invalid, the first output terminal OUTA also outputs an invalid signal.

In addition, the valid level of the pull-up point PU causes the sixteenth transistor T16 and the seventeenth transistor T17 to be turned on, so that the first pull-down control point PD_CNA and the first pull-down point PD_A are connected to the fifth voltage terminal V5. An invalid level is applied to the first pull-down control point PD_CNA and the first pull-down point PD_A, so that the fifteenth transistor T15 is turned off. The invalid signal of the third voltage terminal V3 causes the fourteenth transistor T14 to be turned off.

Therefore, the signal of the pull-up point PU is valid, the signal of the first pull-down control point PD_CNA is invalid, the signal of the first pull-down point PD_A is invalid, and the signal of the first output OUTA is invalid.

In phase P2, the signal of the input signal terminal IP is invalid, the signal of the first clock terminal CLKA is valid, the signal of the first voltage terminal V1 is invalid, the signal of the third voltage terminal V3 is valid, the signal of the fifth voltage terminal V5 is invalid, and the signal of the reset signal terminal RST is invalid.

The signal of the pull-up point PU remains valid and the third transistor T3 remains in an ON state. The valid signal of the first clock terminal CLKA causes the first output terminal OUTA to output a valid signal. The level of the pull-up point PU is further increased by the bootstrap effect of the first capacitor C1, so that the first output terminal OUTA can output the valid level stably.

In addition, the valid level of the pull-up point PU causes the sixteenth transistor T16 and the seventeenth transistor T17 to be turned on, so that the first pull-down control point PD_CNA and the first pull-down point PD_A are connected to the fifth voltage terminal V5. An invalid level is applied to the first pull-down control point PD_CNA and the first pull-down point PD_A, so that the tenth transistor T15 is turned off. At this time, the first pull-down control point PD_CNA is connected to the high level through the fourteenth transistor T14, and to the low level through the sixteenth transistor T16. In the embodiment of the present disclosure, the characteristic parameters (for example, the width-to-length ratio) of the fourteenth transistor T14 and the sixteenth transistor T16 are set such that the level of the first pull-down control point PD_CNA remains to be low. Therefore, although the valid signal of the third voltage terminal V3 cause the fourteenth transistor T14 to be turned on, it cannot change the level of the first pull-down control point PD_CNA and the level of the first pull-down point PD_A.

Therefore, the signal of the pull-up point PU is valid, the signal of the first pull-down control point PD_CNA is invalid, the signal of the first pull-down point PD_A is invalid, and the signal of the first output OUTA is valid.

In phase P3, the signal of the input signal terminal IP is invalid, the signal of the first clock terminal CLKA is invalid, the signal of the first voltage terminal V1 is invalid, the signal of the third voltage terminal V3 is invalid, and the signal of the fifth voltage terminal V5 is invalid. The signal of the reset signal RST is switched from invalid to valid.

The invalid signal of the first clock terminal CLKA causes the signal of the first output terminal OUTA to be invalid. When the signal of the reset signal terminal RST is valid, the second transistor T2 is turned on, the pull-up point PU and the fifth voltage terminal V5 are turned on, and the level of the pull-up point PU is switched to be invalid. The first pull-down control point PD_CNA and the first pull-down point PD_A are disconnected from the fifth voltage terminal V5, but the level of the first pull-down control point PD_NA and the level of the first pull-down point PD_A remains to be invalid, since the third voltage terminal V3 is invalid.

Therefore, in phase P3, the signal of the pull-up point PU is switched from valid to invalid, the signal of the first pull-down control point PD_CNA is invalid, the signal of the first pull-down point PD_A is invalid, and the signal of the first output terminal OUTA is invalid.

In phase P4, the signal of the input signal terminal IP is invalid, the signal of the first clock terminal CLKA is switched between valid and invalid, the signal of the first voltage terminal V1 is invalid, and the signal of the third voltage terminal V3 is between valid and invalid, the signal of the fifth voltage terminal V5 is invalid and the signal of the reset signal terminal RST is switched from valid to invalid.

Since the signal of the input signal terminal IP remains to be invalid, the level of the pull-up point PU remains to be invalid. The third transistor T3 is always in an OFF state, and the first output terminal OUTA outputs an invalid signal. In addition, when the signal of the third voltage terminal V3 is valid, the signals of the first pull-down control point PD_CNA and the first pull-down point PD_A are valid. Similarly, in this phase, when the signal of the fourth voltage terminal V4 is valid, the signals of the second pull-down control point PD_CNB and the second pull-down point PD_B are valid. Therefore, the signals of the first pull-down point PD_A and the second pull-down point PD_B are alternately valid, so that either the eighth transistor T8 and the ninth transistor T9 are turned on, or the tenth transistor T10 and the eleventh transistor T11 are turned on, and thus the connection between the first output terminal OUTA and the first voltage terminal V1 maintains, thereby the signal outputted from the first output terminal OUTA maintains to be invalid.

Therefore, in phase P4, the signal of the pull-up point PU is invalid, and the signal of the first output OUTA signal is invalid.

Next, the waveform of the signal of the second output terminal OUTB will be described. During phases P1 to P4, the signal of the second clock terminal CLKB is always valid. Therefore, the second output terminal OUTB outputs an valid signal, as long as the pull-up point PU is valid which causes the fourth transistor T4 to be turned on. When the level of the PU is invalid, the signals of the first pull-down point PD_A and the second pull-down point PD_B are alternately valid, so that the twelfth transistor T12 and the thirteenth transistor T13 are alternately turned on, maintaining the connection between the second output terminal OUTB and the second voltage terminal V2, and the signal of the second voltage terminal V2 is always valid, thereby the signal output from the second output terminal OUTB maintains to be valid.

Finally, the waveform of the third output terminal OUTC will be described. In phase P2, since the level of the pull-up point PU is valid, the fifth transistor T5 is turned on, and thus the third output terminal OUTC and the third clock terminal CLKC are connected. The signal of the third clock terminal CLKC is valid, which causes the third output terminal OUTC outputs a valid signal. In other phases, the level of the pull-up point PU and the signal of the third clock terminal CLKC cannot be valid at the same time, and the third output terminal OUTC outputs an invalid signal.

In the above description, phase P2 may be the first time period, and phases P1, P3 and P4 may be the second time period.

In FIG. 12, the signal of the first clock terminal CLKA in the second frame is same as the signal of the second clock terminal CLKB in the first frame, and the signal of the second clock terminal CLKB in the second frame is same as the signal of the first clock terminal CLKA in the first frame. The signal of the first voltage terminal V1 in the second frame is same as the signal of the second voltage terminal V2 in the first frame, and the signal of the second voltage terminal V2 in the second frame is same as the signal of the first voltage terminal V1 in the first frame. The signal of the third voltage terminal V3 in the second frame is same as the signal of the fourth voltage terminal V4 in the first frame, and the signal of the fourth voltage terminal V4 in the second frame is same as the signal of the third voltage terminal V3 in the first frame. This causes the signal output from the first output terminal OUTA in the second frame to be same as the signal output from the second output terminal OUTB in the first frame, and the signal output from the second output terminal OUTB in the second frame is same as the signal output from the first output terminal OUTA in the first frame. During the second time period of the first frame and the second time period of the second frame, the state of the signal output from the first output terminal OUTA is switched between valid and invalid, and the state of the signal outputted from the second output terminal OUTB is also switched between valid and invalid.

It should be understood that the first frame and the second frame may be frames occurred alternately. Alternatively, successive multiple first frames may occur, and then a second frame(s) occur.

Figure 13:
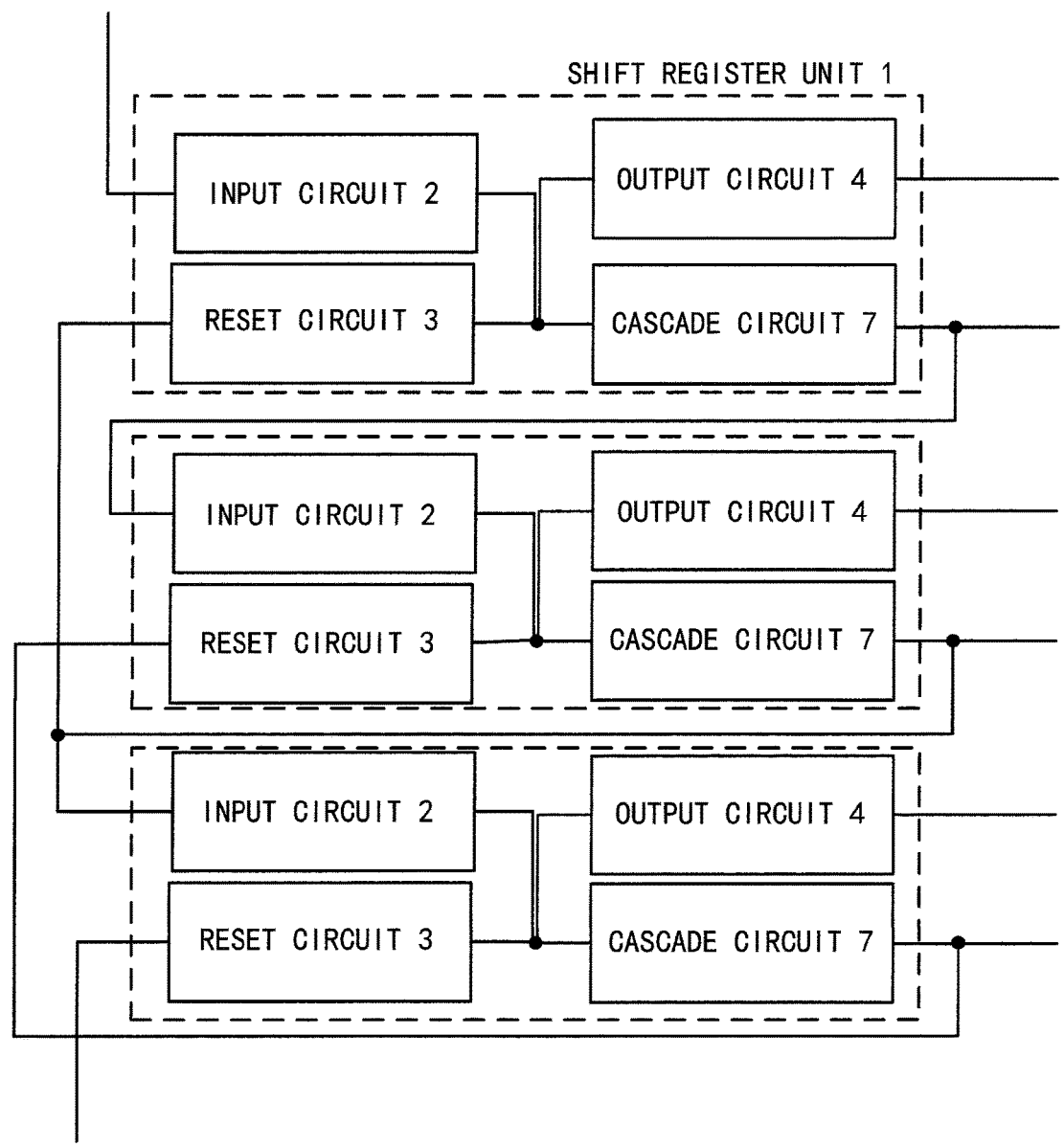
FIG. 13 is a schematic block diagram of a gate drive circuit according to an embodiment of the present disclosure.

FIG. 13 is a schematic block diagram of a gate drive circuit according to an embodiment of the present disclosure. As shown in FIG. 13, the third output terminal OUTC of the cascade circuit 7 of the shift register unit 1 in the current stage may be coupled to the reset input signal terminal RST of the reset circuit 3 of the shift register unit 1 in the previous stage, and to the input signal terminal IP of the input circuit 2 of the shift register unit 1 in the next stage. The "coupling" comprises a direct connection or a connection via a signal adjustment circuit. The signal adjustment circuit can realize signal delay, waveform adjustment and other functions, so as to carry out correct timing control. The number of intermediate stages between the shift register units 1 that are coupled with each other may also be determined in accordance with a specific timing.

It should be understood that, FIG. 13 does not show the pull-down circuit 5, the pull-down control circuit 6, the cascade pull-down circuit 8, the cascade pull-down control circuit 9, and etc., in order to highlight the circuits associated with the cascade.

Figure 14:
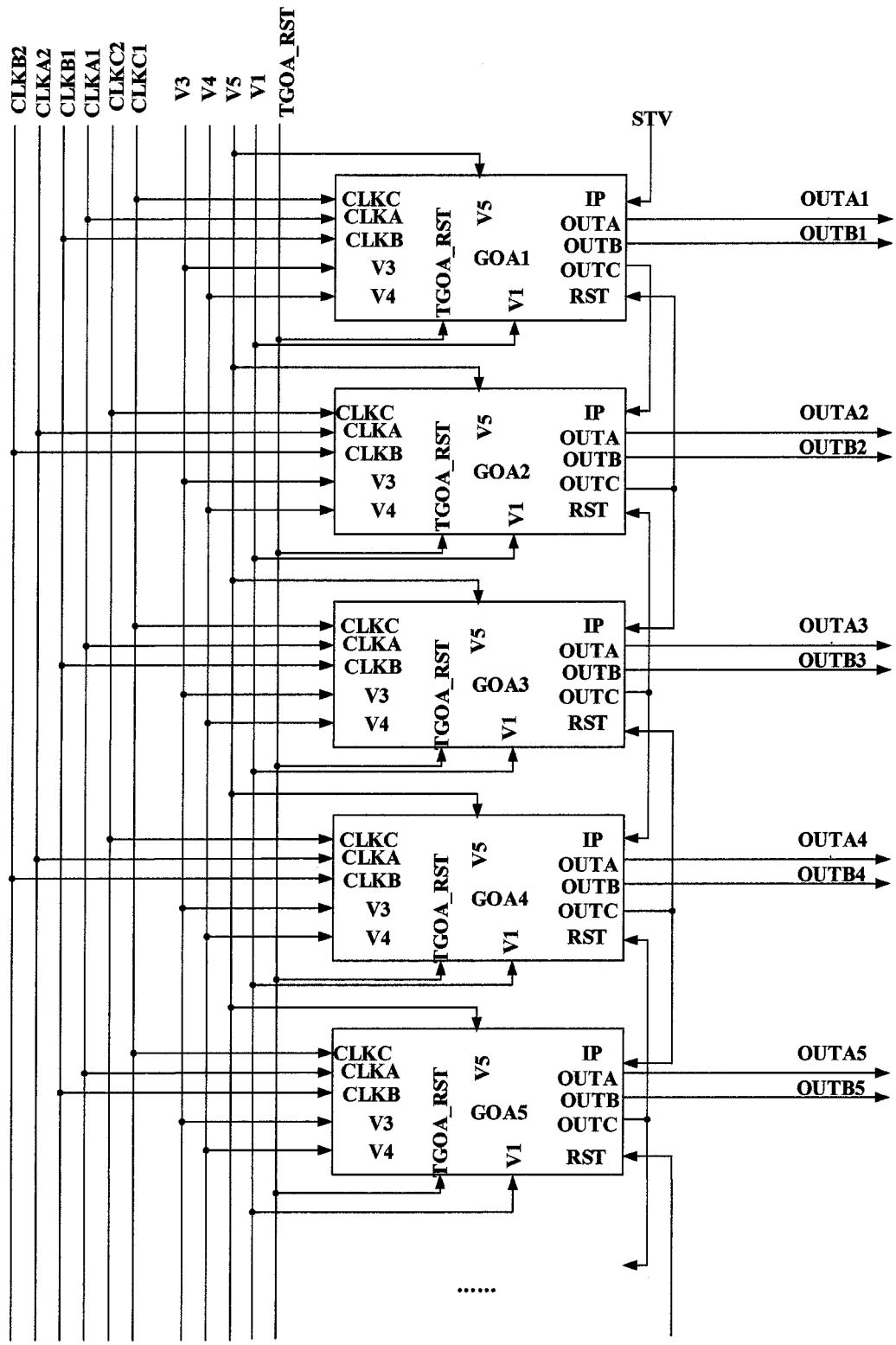
FIG. 14 is a schematic diagram of the electrical connection relationship of the gate drive circuit according to the embodiment of the present disclosure.

FIG. 14 is a schematic diagram of the electrical connection relationship of the gate drive circuit according to the embodiment of the present disclosure. As shown in FIG. 14, the gate driving circuit comprises a plurality of cascaded shift register units GOA1, GOA2, GOA3, GOA4, GOA5, . . . . The shift register units of the gate driving circuit are described by taking the configuration of the shift register unit shown in FIG. 8 as an example.

The output terminal (i.e., the third output terminal OUTC) of the cascade circuit of the shift register unit in one stage is connected to the input terminal IP of the shift register unit in the next stage. The output terminal (i.e., the third output terminal OUTC) of the cascade circuit of the shift register unit in one stage is connected to the reset signal terminal RST of the shift register unit in the previous stage. The first voltage terminal V1, the third voltage terminal V3, the fourth voltage terminal V4, the fifth voltage terminal V5, and the overall reset signal terminal TGOA_RST are connected to all of the shift register units.

The clock terminals are divided into two groups. The clock signals of the first group comprise the first clock terminal CLKA1, the second clock terminal CLKB1 and a third clock terminal CLK C1, which are connected with the first shift register unit GOA1, the third shift register unit GOA3, and the fifth shift register unit GOA5 . . . . The clock signals of the second group comprise the first clock terminal CLKA2, the second clock terminal CLKB2, and a third clock terminal CLK C2, which are connected with the second shift register unit GOA2, the fourth shift register unit GOA4 . . . .

Figure 15:
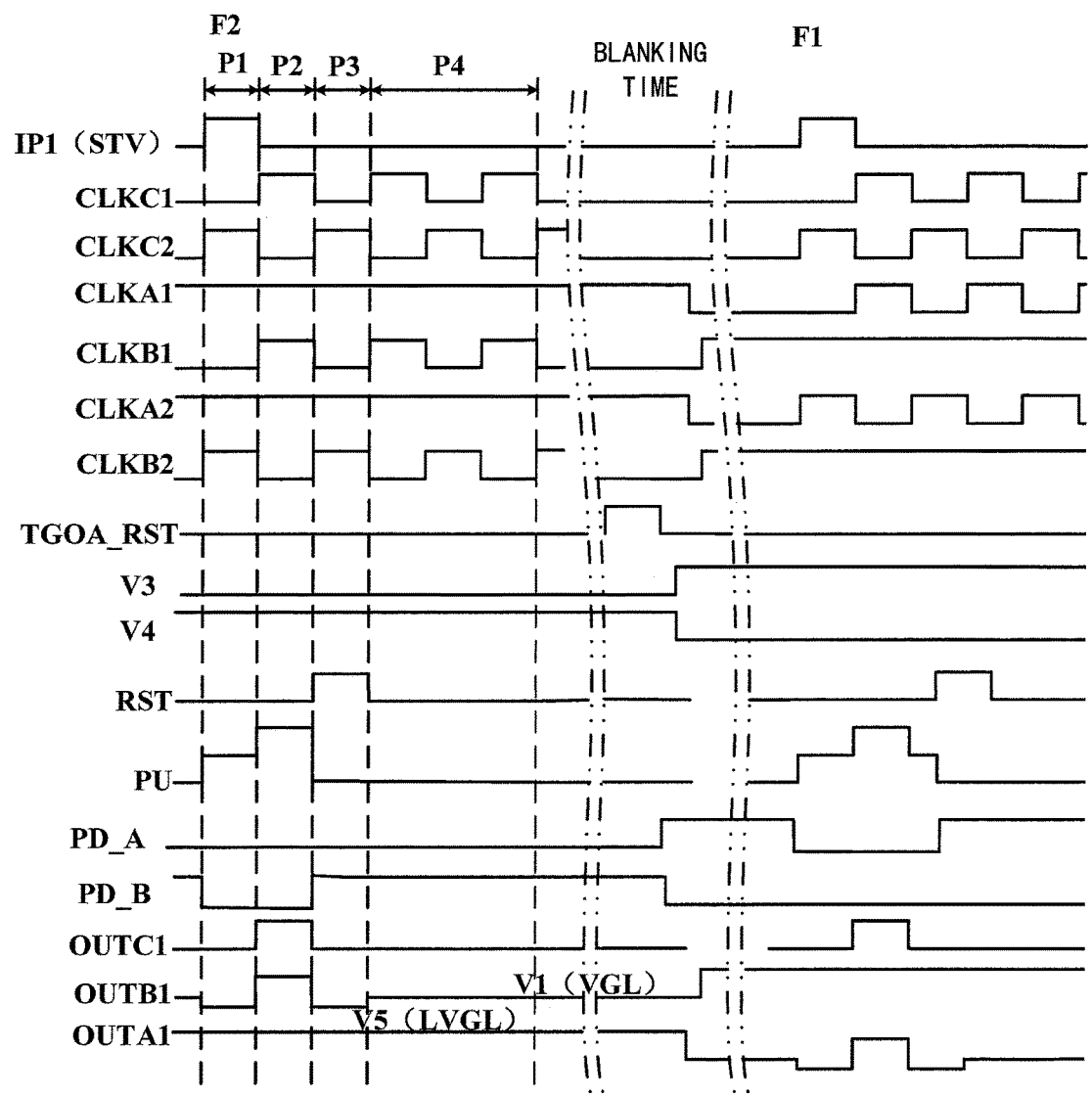
FIG. 15 is a signal timing chart of the circuit shown in FIG. 14.

FIG. 15 is a signal timing chart of the circuit shown in FIG. 14. FIG. 15 differs from FIG. 9 in that a second group of clock signals are added, and the signal of the reset signal terminal RST is in synchronization with the signal of the third clock terminal CLKC2.

Since the output terminal (i.e., the third output terminal OUTC) of the cascade circuit of the shift register unit in one stage is directly connected to the reset signal terminal RST of the shift register unit in the previous stage, the signal of the reset signal terminal RST is in synchronization with the signal of the third clock terminal CLKC2 in phase P3, which is different from the case shown in FIG. 9.

In addition, it should be understood that the signal of the reset signal terminal RST in FIG. 9 may be implemented in a number of ways.

For example, a third group of clock signal terminals and a multiple of shift register units connected to the third group of clock signal terminals may be added to the circuit shown in FIG. 14, in order to generate the signal of the reset signal terminal RST in FIG. 9.

The added third group of clock signal terminals comprise the first clock terminal CLKA3 (i.e., CLKC1), the second clock terminal CLKB3 (i.e. CLKC2), and a third clock terminal CLKC3 (i.e., RST). The clock signal of the third clock terminal CLKC3 of the third group has a phase difference with respect to the clock signal of the third clock terminal CLK2 of the second group, so that the output terminal of the cascade circuit of the newly added shift register unit can output the signal of the reset signal terminal RST as shown in FIG. 9, which is not in synchronization with the signal of the third clock terminal CLK2 of the second group in phase P3. In addition, it is also possible to connect the output terminal (i.e., the third output terminal OUTC) of the cascade circuit of the shift register unit in one stage to the reset signal terminal RST of the shift register unit in the previous stage by using various delay circuit connections, so as to achieve time delay.

An embodiment of the present disclosure also provides a driving method of a shift register unit, which is used for driving the shift register units described above, wherein the connection point connecting the input circuit with the plurality of output circuits is a pull-up point. The driving method comprises:

during the first time period, causing the voltage of the pull-up point to be valid, the clock signals of the plurality of output circuits to be valid, so that the output signals of the plurality of output circuits are valid;

during the second time period, pulling down the voltage of the output signal of at least one of the plurality of output circuits by the pull-down circuit to an invalid voltage, so that the output signal of the at least one output circuit is invalid, wherein the second time period comprises the first sub-period and the second sub-period, the state of at least one of the output signals of the plurality of output circuits during the first sub-period is opposite to the state thereof during the second sub-period.

Preferably, in the driving method of the shift register unit, the time period of each frame comprises the first time period and the second time period. The plurality of output circuits comprises the first output circuit and the second output circuit. The driving method further comprises:

during the second time period of the first frame, pulling down the output signal of the first output circuit by the pull-down circuit to an invalid voltage, so that the signal output from the second output circuit is valid;

during the second time period of the second frame, pulling down the output signal of the second output circuit by the pull-down circuit to an invalid voltage, so that the signal output from the first output circuit is valid.

As shown in FIGS. 9 and 12, there is also a blanking time between two successive frames, which can avoid the impact of the voltage charged into the pixel unit in the previous frame on the current frame. The gate line needs a certain reaction time between two successive frames to make the gate driving circuit return from the last row to the first row, wherein the reaction time is the blanking time.

An embodiment of the present disclosure also provides a display substrate comprising the gate driving circuit and the pixel unit described above, such as the gate driving circuit shown in FIG. 13 or 14 and the pixel unit shown in FIG. 3.

An embodiment of the present disclosure also provides a display device comprising the display substrate described above. The display device may be any product or component with display function, such as a mobile phone, a tablet computer, a TV set, a monitor, a notebook computer, a digital photo frame, a navigator, or the like.

It should be noted that, in the above description, the high level and the low level are only used to identify whether a voltage can turn on a transistor or not, and there is no limitation on specific voltage values. For example, the low level may refer to a ground level or a negative level. In addition, though the N-type TFT transistors are selected for the above schematically illustration, the present invention is not limited to the specific type of transistors. In accordance with the principles of the present disclosure, those skilled in the art will be able to make appropriate selections and adjustments on the type of transistors without any creative work, and these selections and adjustments are also considered to be within the scope of the present disclosure.

It may be understood that the above embodiments are merely illustrative embodiments for the purpose of illustrating the principles of the present invention, but the present invention is not limited thereto. It will be apparent to those skilled in the art that various changes and modifications can be made without departing from the spirit and scope of the disclosure, which are also considered to be within the scope of the present disclosure.

What is claimed is:

1. A shift register unit, comprising: an input circuit, a reset circuit, a plurality of output circuits, a plurality of pull-down circuits and a plurality of pull-down control circuits, wherein the input circuit is connected to the plurality of output circuits and configured to receive an input signal and output the received input signal to the plurality of output circuits;

the reset circuit is configured to reset the plurality of output circuits according to a reset signal;

the plurality of output circuits are configured to output output signals based on the input signal and clock signals;

the plurality of pull-down circuits are connected to output terminals of the plurality of output circuits and are configured to pull down voltages at the output terminals of the plurality of output circuits;

the plurality of pull-down control circuits are connected to the plurality of pull-down circuits and are configured to control the plurality of pull-down circuits;

wherein, the shift register unit is configured so that,
during a first time period, all of the output signals of the plurality of output circuits are valid, and
during a second time period, at least one of the output signals of the plurality of output circuits is invalid, wherein the second time period comprises a first sub-period and a second sub-period, and a state of at least one of the output signals of the plurality of output circuits during the first sub-period is opposite to a state thereof during the second sub-period, wherein a time period of each of frames comprises a first time period and a second time period;

the frames comprises a first frame and a second frame;

the plurality of output circuits comprise a first output circuit and a second output circuit;

wherein, during the second time period of the first frame, the output signal of the first output circuit is invalid, and the output signal of the second output circuit is valid;

during the second time period of the second frame, the output signal of the second output circuit is invalid, and the output signal of the first output circuit is valid.

2. The shift register unit of claim 1, wherein,
the plurality of pull-down circuits comprise a first pull-down circuit and a second pull-down circuit; the plurality of pull-down control circuits comprise a first pull-down control circuit and a second pull-down control circuit;

a connection point connecting the input circuit with the plurality of output circuits is a pull-up point; a connection point connecting the first pull-down control circuit with the first pull-down circuit is a first pull-down point; a connection point connecting the second pull-down control circuit with the second pull-down circuit is a second pull-down point;

the first output circuit is connected to the pull-up point and a first clock terminal, and the first output circuit provides a first output terminal;

the first pull-down circuit is connected to the first pull-down point, a first voltage terminal, a fifth voltage terminal, the pull-up point, and the first output terminal;

the first pull-down control circuit is connected to the input signal terminal, the pull-up point, a third voltage terminal, the first output terminal, the fifth voltage terminal, and the first pull-down point;

the second output circuit is connected to the pull-up point and a second clock terminal, and the second output circuit provides a second output terminal;

the second pull-down circuit is connected to the second pull-down point, the first voltage terminal, the fifth voltage terminal, the pull-up point, and the second output terminal; and the second pull-down control circuit is connected to the input signal terminal, the pull-up point, a fourth voltage terminal, the second output terminal, the fifth voltage terminal, and the second pull-down point.

3. The shift register unit of claim 2, wherein,
the input circuit comprises a first transistor, which has a control terminal and a first terminal both connected to the input signal terminal, and a second terminal connected to the pull-up point;

the reset circuit comprises a second transistor, which has a control terminal connected to a reset signal terminal, a first terminal connected to the fifth voltage terminal, and a second terminal connected to the pull-up point.

4. The shift register unit of claim 2, wherein
the first output circuit comprises a third transistor and a first capacitor, wherein the third transistor has a control terminal connected to the pull-up point, s first terminal connected to the first clock terminal, and a second terminal connected to one of the plurality of pull-down circuits, the first capacitor being connected between the control terminal and the second terminal of the third transistor, and a connection point connecting the second terminal of the third transistor with the first capacitor being the first output terminal;

the second output circuit comprises a fourth transistor and a second capacitor, wherein the fourth transistor has a control terminal connected to the pull-up point, a first terminal connected to the second clock terminal, and a second terminal connected to one of the plurality of pull-down circuits, the second capacitor being connected between the control terminal and the second terminal of the fourth transistor, and a connection point connecting the second terminal of the fourth transistor with the second capacitor being the second output terminal.

5. The shift register unit of claim 2, further comprising: a cascade circuit, a cascade pull-down circuit, and a cascade pull-down control circuit, wherein the cascade circuit is configured to output a cascade signal that is used as at least one of an input signal and a reset signal of another shift register unit;

the cascade pull-down circuit is connected to an output terminal of the cascade circuit, and is configured to pull-down the output terminal of the cascade circuit;

the cascade pull-down control circuit is connected to the cascade pull-down circuit, and is configured to control the cascade pull-down circuit;

the cascade circuit comprises a fifth transistor, wherein the fifth transistor has a control terminal connected to the pull-up point, a first terminal connected to a third clock terminal, and a second terminal connected to a third output terminal and also to the cascade pull-down circuit;

the cascade pull-down circuit comprises a sixth transistor and a seventh transistor, wherein the sixth transistor has a control terminal connected to the cascade pull-down control circuit, a first terminal connected to the fifth voltage terminal, and a second terminal connected to the third output terminal; the seventh transistor has a control terminal connected to the cascade pull-down control circuit, a first terminal connected to the fifth voltage terminal, and a second terminal connected to the third output terminal;

the cascade pull-down control circuit multiplexes the plurality of pull-down control circuits, the control terminal of the sixth transistor being connected to a first pull-down control circuit of the plurality of pull-down control circuits, the control terminal of the seventh transistor being connected to a second pull-down control circuit of the plurality of pull-down control circuits.

6. The shift register unit of claim 2, wherein
the first pull-down circuit comprises an eighth transistor and a ninth transistor, wherein the eighth transistor has a control terminal connected to the first pull-down point, a first terminal connected to the fifth voltage terminal, and a second terminal connected to the pull-up point; the ninth transistor has a control terminal connected to the first pull-down point, a first terminal connected to the first voltage terminal, and a second terminal connected to the first output terminal;
the second pull-down circuit comprises a tenth transistor and an eleventh transistor, wherein of the tenth transistor has a control terminal connected to the second pull-down point, a first terminal connected to the fifth voltage terminal, and a second terminal connected to the pull-up point; the eleventh transistor has a control terminal connected to the second pull-down point, a first terminal connected to the first voltage terminal, and a second terminal connected to the second output terminal.

7. The shift register unit according to claim 6, wherein
the first pull-down control circuit comprises a twelfth transistor, a thirteenth transistor, a fourteenth transistor and a fifteenth transistor, wherein the twelfth transistor has a control terminal and a first terminal both connected to the third voltage terminal, and a second terminal connected to the first pull-down point; the thirteenth transistor has a control terminal connected to the pull-up point, a first terminal connected to the fifth voltage terminal, and a second terminal connected to the first pull-down point; the fourteenth transistor has a control terminal connected to the input signal terminal, a first terminal connected to the fifth voltage terminal, and a second terminal connected to the first pull-down point; the fifteenth transistor has a control terminal connected to the first output terminal, a first terminal connected to the fifth voltage terminal, and a second terminal connected to the first pull-down point;
the second pull-down control circuit comprises a sixteenth transistor, a seventeenth transistor, an eighteenth transistor and a nineteenth transistor, wherein the sixteenth transistor has a control terminal and a first terminal both connected to the fourth voltage terminal, and a second terminal connected to the second pull-down point; the seventeenth transistor has a control terminal connected to the pull-up point, a first terminal connected to the fifth voltage terminal, and a second terminal connected to the second pull-down point; the eighteenth transistor has a control terminal connected to the input signal terminal, a first terminal connected to the fifth voltage terminal, and a second terminal connected to the second pull-down point; the nineteenth transistor has a control terminal connected to the second output terminal, a first terminal connected to the fifth voltage terminal, and a second terminal connected to the second pull-down point.

8. The shift register unit of claim 7, further comprising an overall reset circuit configured to receive an overall rest signal to reset the shift register unit.

9. The shift register unit of claim 8, wherein the overall reset circuit comprises a twentieth transistor having a control terminal connected to an overall reset signal terminal, a first terminal connected to the fifth voltage terminal, and a second terminal connected to the pull-up point.

10. The shift register unit of claim 1, wherein
the plurality of pull-down circuits comprise a first pull-down circuit and a second pull-down circuit; the plurality of pull-down control circuits comprise a first pull-down control circuit and a second pull-down control circuit;
a connection point connecting the input circuit with the plurality of output circuits is a pull-up point; a connection point connecting the first pull-down control circuit with the first pull-down circuit is a first pull-down point; a connection point connecting the second pull-down control circuit with the second pull-down circuit is a second pull-down point;
the first output circuit is connected to the pull-up point and a first clock terminal, and the first output circuit provides a first output terminal;
the first pull-down circuit is connected to the first pull-down point, the second pull-down point, a first voltage terminal, a fifth voltage terminal, the pull-up point, and the first output terminal;
the first pull-down control circuit is connected to the pull-up point, a third voltage terminal, the fifth voltage terminal, and the first pull-down point;
the second output circuit is connected to the pull-up point and a second clock terminal, and the second output circuit provides a second output terminal;
the second pull-down circuit is connected to the second pull-down point, the first pull-down point, a second voltage terminal, the fifth voltage terminal, the pull-up point, and the second output terminal; and
the second pull-down control circuit is connected to the pull-up point, a fourth voltage terminal, the fifth voltage terminal, and the second pull-down point.

11. The shift register unit of claim 10, wherein
the input circuit comprises a first transistor, which has a control terminal and a first terminal both connected to the input signal terminal, and a second terminal connected to the pull-up point;
the reset circuit comprises a second transistor, which has a control terminal connected to a reset signal terminal, a first terminal connected to the fifth voltage terminal, and a second terminal connected to the pull-up point.

12. The shift register unit of claim 10,
the first output circuit comprises a third transistor and a first capacitor, wherein the third transistor has a control terminal connected to the pull-up point, s first terminal connected to the first clock terminal, and a second terminal connected to one of the plurality of pull-down circuits, the first capacitor being connected between the control terminal and the second terminal of the third transistor, and a connection point connecting the second terminal of the third transistor with the first capacitor being the first output terminal;
the second output circuit comprises a fourth transistor and a second capacitor, wherein the fourth transistor has a control terminal connected to the pull-up point, a first terminal connected to the second clock terminal, and a second terminal connected to one of the plurality of pull-down circuits, the second capacitor being connected between the control terminal and the second terminal of the fourth transistor, and a connection point connecting the second terminal of the fourth transistor with the second capacitor being the second output terminal.

13. The shift register unit of claim 10, further comprising: a cascade circuit, a cascade pull-down circuit, and a cascade pull-down control circuit, wherein the cascade circuit is configured to output a cascade signal that is used as at least one of an input signal and a reset signal of another shift register unit;
the cascade pull-down circuit is connected to an output terminal of the cascade circuit, and is configured to pull-down the output terminal of the cascade circuit;
the cascade pull-down control circuit is connected to the cascade pull-down circuit, and is configured to control the cascade pull-down circuit;
the cascade circuit comprises a fifth transistor, wherein the fifth transistor has a control terminal connected to the pull-up point, a first terminal connected to a third clock terminal, and a second terminal connected to a third output terminal and also to the cascade pull-down circuit;
the cascade pull-down circuit comprises a sixth transistor and a seventh transistor, wherein the sixth transistor has a control terminal connected to the cascade pull-down control circuit, a first terminal connected to the fifth voltage terminal, and a second terminal connected to the third output terminal; the seventh transistor has a control terminal connected to the cascade pull-down control circuit, a first terminal connected to the fifth voltage terminal, and a second terminal connected to the third output terminal;
the cascade pull-down control circuit multiplexes the plurality of pull-down control circuits, the control terminal of the sixth transistor being connected to a first pull-down control circuit of the plurality of pull-down control circuits, the control terminal of the seventh transistor being connected to a second pull-down control circuit of the plurality of pull-down control circuits.

14. The shift register unit of claim 10, wherein
the first pull-down circuit comprises an eighth transistor, a ninth transistor and a tenth transistor, wherein the eighth transistor has a control terminal connected to the first pull-down point, a first terminal connected to the fifth voltage terminal, and a second terminal connected to the pull-up point; the ninth transistor has a control terminal connected to the first pull-down point, a first terminal connected to the first voltage terminal, and a second terminal connected to the first output terminal; the tenth transistor has a control terminal connected to the second pull-down point, a first terminal connected to the first voltage terminal, and a second terminal connected to the first output terminal;
the second pull-down circuit comprises an eleventh transistor, a twelfth transistor and a thirteenth transistor, wherein the eleventh transistor has a control terminal connected to the second pull-down point, a first terminal connected to the fifth voltage terminal, and a second terminal connected to the pull-up point; the twelfth transistor has a control terminal connected to the first pull-down point, a first terminal connected to the second voltage terminal, and a second terminal connected to the second output terminal; the thirteenth transistor has a control terminal connected to the second pull-down point, a first terminal connected to the second voltage terminal, and a second terminal connected to the second output terminal.

15. The shift register unit of claim 14, wherein
the first pull-down control circuit comprises a fourteenth transistor, a fifteenth transistor, a sixteenth transistor and a seventeenth transistor;
wherein the fourteenth transistor has a control terminal and a first terminal both connected to the third voltage terminal, and a second terminal connected to a control terminal of the fifteenth transistor; a connection point connecting the second terminal of the fourteenth transistor with the control terminal of the fifteenth transistor is a first pull-down control point; the fifteenth transistor has a control terminal connected to the second terminal of the fourteenth transistor, a first terminal connected to the third voltage terminal, and a second terminal connected to the first pull-down point; the sixteenth transistor has a control terminal connected to the pull-up point, a first terminal connected to the fifth voltage terminal, and a second terminal connected to the first pull-down control point; the seventeenth transistor has a control terminal connected to the pull-up point, a first terminal connected to the fifth voltage terminal, and a second terminal connected to the first pull-down point;
the second pull-down control circuit comprises an eighteenth transistor, a nineteenth transistor, a twentieth transistor and a twenty-first transistor;
wherein the eighteenth transistor has a control terminal and a first terminal both connected to the fourth voltage terminal, and a second terminal connected to a control terminal of the nineteenth transistor; a connection point connecting the second terminal of the eighteenth transistor with the control terminal of the nineteenth transistor is a second pull-down control point; the nineteenth transistor has a control terminal connected to the second terminal of the eighteenth transistor, a first terminal connected to the fourth voltage terminal, and a second terminal connected to the second pull-down point; the twentieth transistor has a control terminal connected to the pull-up point, a first terminal connected to the fifth voltage terminal, and a second terminal connected to the second pull-down control point; the twenty-first transistor has a control terminal connected to the pull-up point, a first terminal connected to the fifth voltage terminal, and a second terminal connected to the second pull-down point.

16. A gate driving circuit, comprising: a plurality of cascaded shift register units of claim 1.

17. A display device comprising the gate driving circuit of claim 16.

18. A driving method of a shift register unit, which is used for driving the shift register unit of claim 1, wherein the connection point connecting the input circuit with the plurality of output circuits is the pull-up point, the driving method comprising:
during a first time period, causing a voltage at the pull-up point is valid and the clock signals for the plurality of output circuits to be valid, so that the output signals of the plurality of output circuits are valid; and
during a second time period, pulling up an voltage at an output terminal of at least one output circuit by the pull-down circuit to an invalid one, so that the output signal of at least one output circuit is invalid, wherein the second time period comprises a first sub-period and a second sub-period, and the state of at least one of the output signals of the plurality of output circuits during the first sub-period is opposite to the state thereof during the second sub-period.

* * * * *